United States Patent
Sio et al.

(10) Patent No.: US 11,688,730 B2
(45) Date of Patent: Jun. 27, 2023

(54) METHOD AND SYSTEM OF MANUFACTURING CONDUCTORS AND SEMICONDUCTOR DEVICE WHICH INCLUDES CONDUCTORS

(71) Applicant: TAIWAN SEMICONDUCTOR MANUFACTURING COMPANY, LTD., Hsinchu (TW)

(72) Inventors: Kam-Tou Sio, Hsinchu (TW); Chih-Liang Chen, Hsinchu (TW); Hui-Ting Yang, Hsinchu (TW); Shun Li Chen, Hsinchu (TW); Ko-Bin Kao, Hsinchu (TW); Chih-Ming Lai, Hsinchu (TW); Ru-Gun Liu, Hsinchu (TW); Charles Chew-Yuen Young, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 157 days.

(21) Appl. No.: 17/225,664

(22) Filed: Apr. 8, 2021

(65) Prior Publication Data

US 2021/0225831 A1 Jul. 22, 2021

Related U.S. Application Data

(62) Division of application No. 16/544,373, filed on Aug. 19, 2019, now Pat. No. 10,978,439, which is a
(Continued)

(51) Int. Cl.
*H01L 27/02* (2006.01)
*H01L 21/3213* (2006.01)
(Continued)

(52) U.S. Cl.
CPC .... *H01L 27/0207* (2013.01); *H01L 21/32133* (2013.01); *H01L 21/32139* (2013.01);
(Continued)

(58) Field of Classification Search
CPC .......... H01L 27/0207; H01L 21/32133; H01L 21/32139; H01L 21/823431;
(Continued)

(56) References Cited

U.S. PATENT DOCUMENTS 8,008,206 B2 8/2011 Liang et al.
8,217,469 B2 7/2012 Hou et al.
(Continued)

FOREIGN PATENT DOCUMENTS

JP 2003218113 7/2003
KR 10-2016-0123960 10/2016

OTHER PUBLICATIONS

Office Action dated Mar. 21, 2019 from corresponding application No. KR 10-2017-0117636.
(Continued)

*Primary Examiner* — Bitew A Dinke
(74) *Attorney, Agent, or Firm* — Hauptman Ham, LLP

(57) ABSTRACT

A system that generates a layout diagram has a processor that implements a method, the method including: generating first and second conductor shapes; generating first, second and third cap shapes correspondingly over the first and second conductor shapes; arranging a corresponding one of the second conductor shapes to be interspersed between each pair of neighboring ones of the first conductor shapes; generating first cut patterns over selected portions of corresponding ones of the first cap shapes; and generating second cut patterns over selected portions of corresponding ones of the second cap shapes. In some circumstances, the first cut patterns are designated as selective for a first etch sensitivity
(Continued)

corresponding to the first cap shapes; and the second cut patterns are designated as selective for a second etch sensitivity corresponding to the second cap shapes.

20 Claims, 16 Drawing Sheets

Related U.S. Application Data division of application No. 15/676,225, filed on Aug. 14, 2017, now Pat. No. 10,388,644.

(60) Provisional application No. 62/427,570, filed on Nov. 29, 2016.

(51) Int. Cl.
   *H01L 21/8234* (2006.01)
   *H01L 27/088* (2006.01)
   *H01L 29/417* (2006.01)
   *H01L 29/423* (2006.01)
   *H01L 27/11* (2006.01)

(52) U.S. Cl.
   CPC ............ *H01L 21/823431* (2013.01); *H01L 21/823475* (2013.01); *H01L 27/0886* (2013.01); *H01L 29/41791* (2013.01); *H01L 29/42376* (2013.01); H01L 21/823437 (2013.01); H01L 27/1104 (2013.01); H01L 27/1116 (2013.01)

(58) Field of Classification Search
   CPC ......... H01L 21/823475; H01L 27/0886; H01L 29/41791; H01L 29/42376; H01L 21/823437; H01L 27/1104; H01L 27/1116; H01L 21/308; H01L 21/3088; H01L 29/66795; H01L 29/785; H01L 21/0274; H01L 21/76829; G03F 1/36; G03F 7/70441
   See application file for complete search history.

(56) References Cited

U.S. PATENT DOCUMENTS

| | | | |
|---|---|---|---|
| 8,381,139 B2 | 2/2013 | Lin et al. | |
| 8,418,111 B2 | 4/2013 | Chen et al. | |
| 8,536,064 B2 | 9/2013 | Ko et al. | |
| 8,850,367 B2 | 9/2014 | Lai et al. | |
| 8,975,129 B1 | 3/2015 | Shieh et al. | |
| 9,098,668 B2 | 8/2015 | Tien et al. | |
| 9,123,656 B1 | 9/2015 | Hsieh et al. | |
| 9,355,912 B2 | 5/2016 | Wu et al. | |
| 9,367,661 B2 | 6/2016 | Jou et al. | |
| 9,520,482 B1 | 12/2016 | Chang et al. | |
| 9,679,994 B1 | 6/2017 | Chou | |
| 9,818,613 B1 | 11/2017 | Huang et al. | |
| 9,911,619 B1 | 3/2018 | Xie | |
| 9,991,257 B2 * | 6/2018 | Park | H01L 29/0649 |
| 10,096,605 B2 * | 10/2018 | Park | H01L 29/06 |
| 10,170,307 B1 | 1/2019 | Huang et al. | |
| 10,325,898 B2 * | 6/2019 | Deepak | H01L 27/088 |
| 10,388,644 B2 | 8/2019 | Sio et al. | |
| 10,559,492 B2 * | 2/2020 | Peng | H01L 23/5286 |
| 2007/0099431 A1 * | 5/2007 | Li | H01L 21/3088 |
| | | | 438/689 |
| 2007/0205443 A1 | 9/2007 | Juengling | |
| 2008/0227250 A1 | 9/2008 | Ranade et al. | |
| 2012/0208361 A1 * | 8/2012 | Ha | H01L 21/30604 |
| | | | 438/597 |
| 2012/0282778 A1 | 11/2012 | Light | |
| 2013/0329486 A1 | 12/2013 | Juengling | |
| 2014/0065823 A1 | 3/2014 | Sipani | |
| 2014/0110817 A1 | 4/2014 | Bergendahl | |
| 2015/0147867 A1 | 5/2015 | Shieh et al. | |
| 2015/0155198 A1 | 6/2015 | Tsai et al. | |
| 2015/0162339 A1 | 6/2015 | Divakaruni | |
| 2015/0214064 A1 * | 7/2015 | Pritchard | H01L 21/3086 |
| | | | 438/585 |
| 2015/0348967 A1 | 12/2015 | Lee et al. | |
| 2016/0093502 A1 | 3/2016 | Cheng et al. | |
| 2016/0254191 A1 | 9/2016 | Tseng et al. | |
| 2016/0307769 A1 | 10/2016 | Tseng et al. | |
| 2016/0307802 A1 | 10/2016 | Lee et al. | |
| 2016/0315146 A1 * | 10/2016 | Jung | H01L 21/823431 |
| 2017/0062420 A1 * | 3/2017 | You | H01L 29/4238 |
| 2017/0092506 A1 | 3/2017 | deVilliers | |
| 2017/0221902 A1 | 8/2017 | Kang | |
| 2017/0317089 A1 | 11/2017 | Chen et al. | |
| 2017/0372906 A1 | 12/2017 | Jang et al. | |
| 2018/0096846 A1 | 4/2018 | Arnold et al. | |
| 2018/0138051 A1 | 5/2018 | deVilliers | |
| 2019/0305006 A1 | 10/2019 | Liu et al. | |

OTHER PUBLICATIONS

Notice of Allowance dated Jul. 1, 2019 from corresponding application No. KR 10-2017-0117636.

* cited by examiner

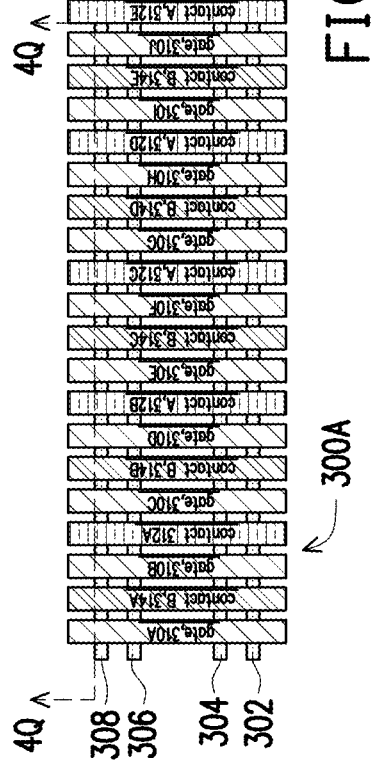
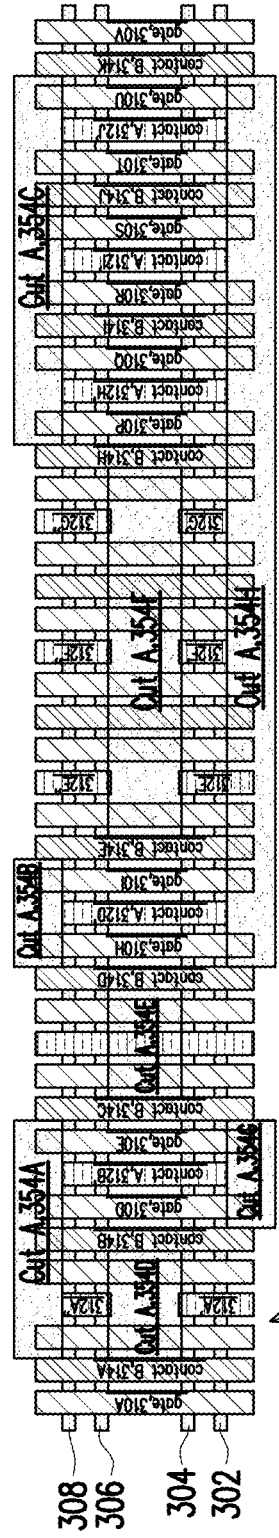
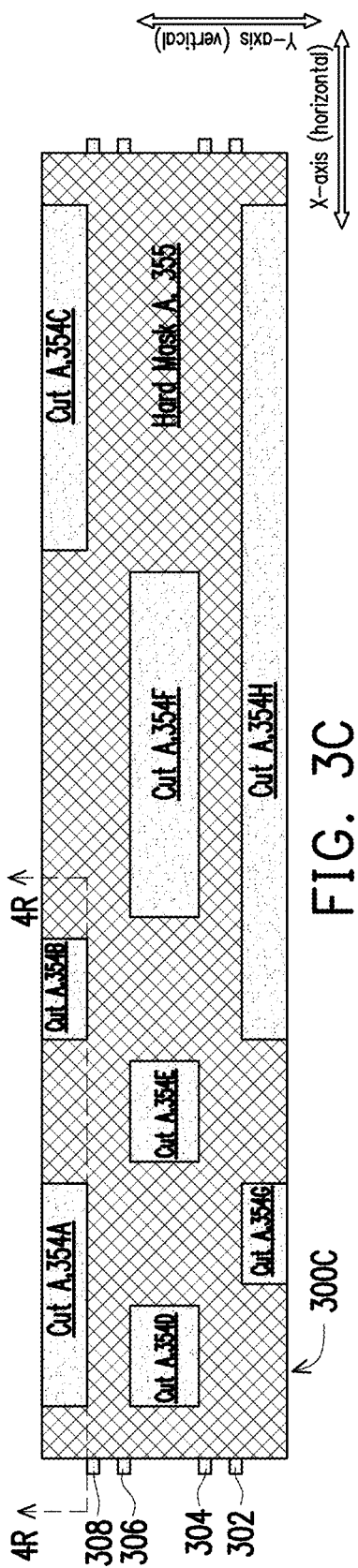
FIG. 3A
FIG. 3B
FIG. 3C

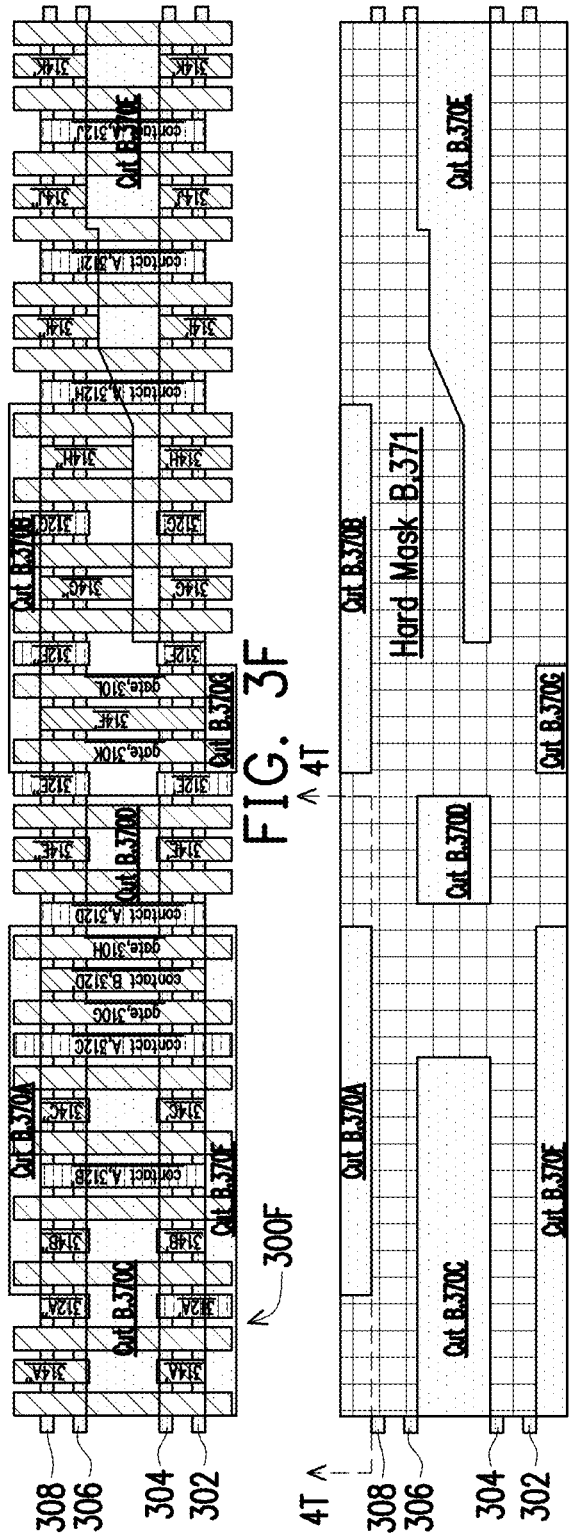
FIG. 3F
FIG. 3G
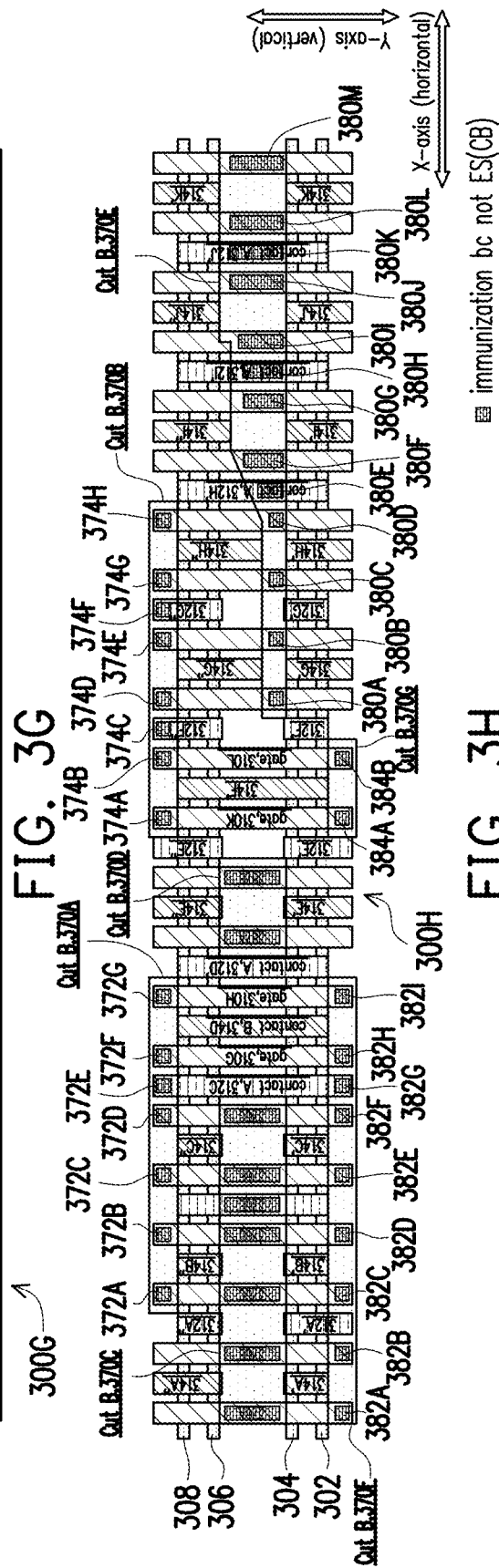
FIG. 3H

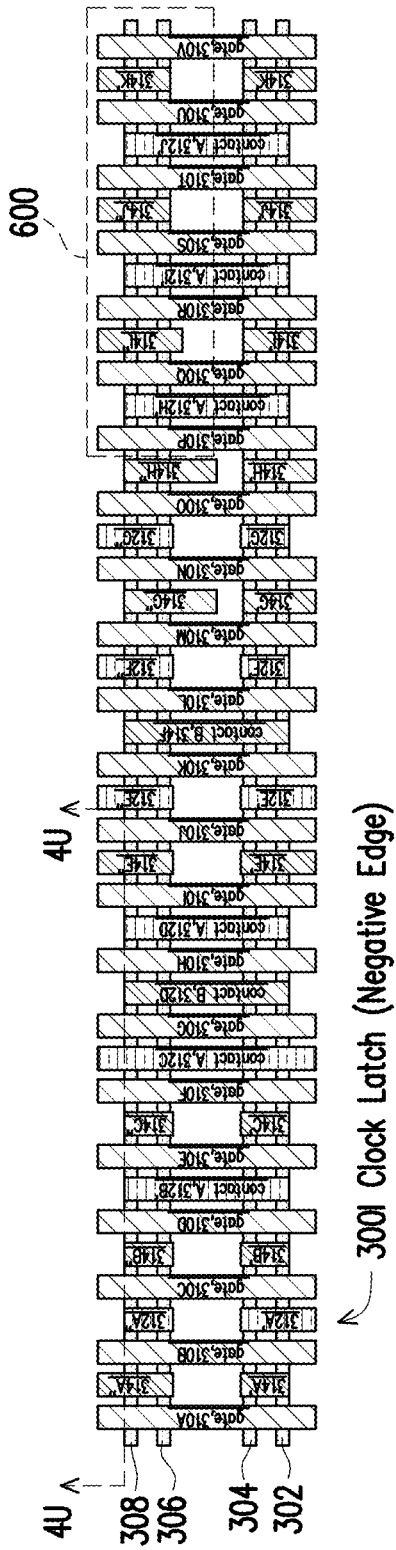
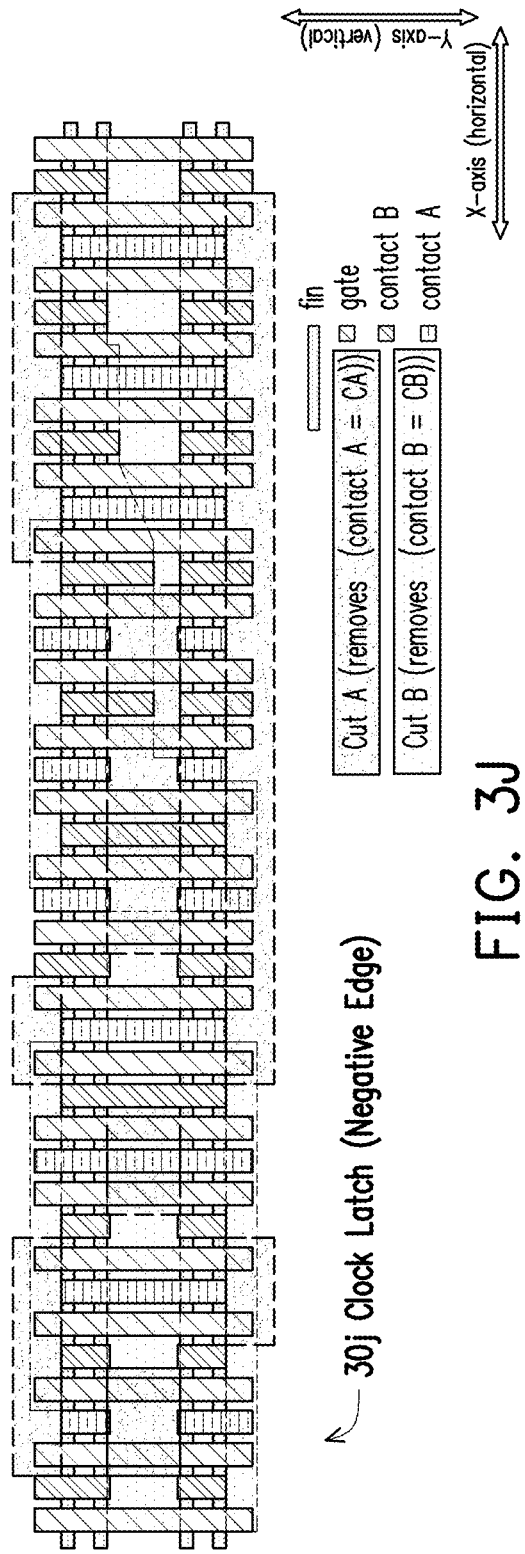
FIG. 3I
FIG. 3J

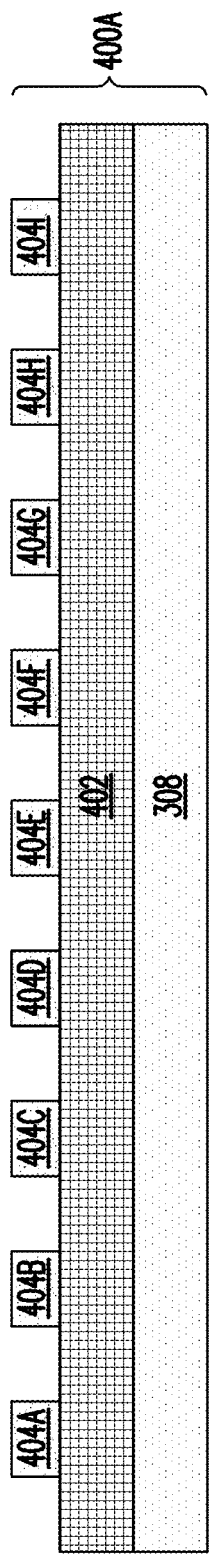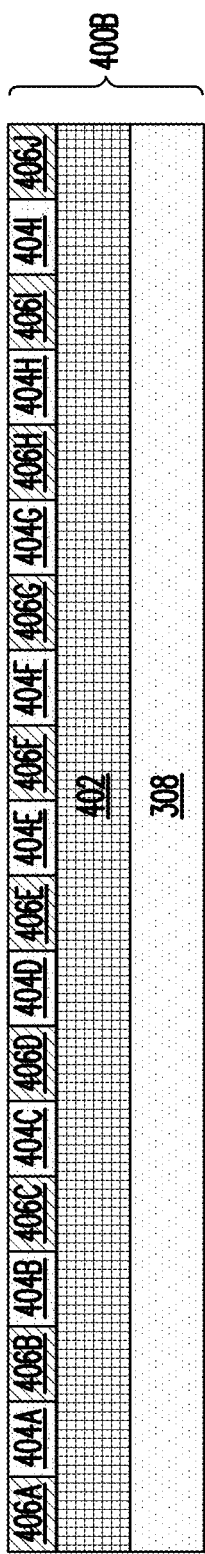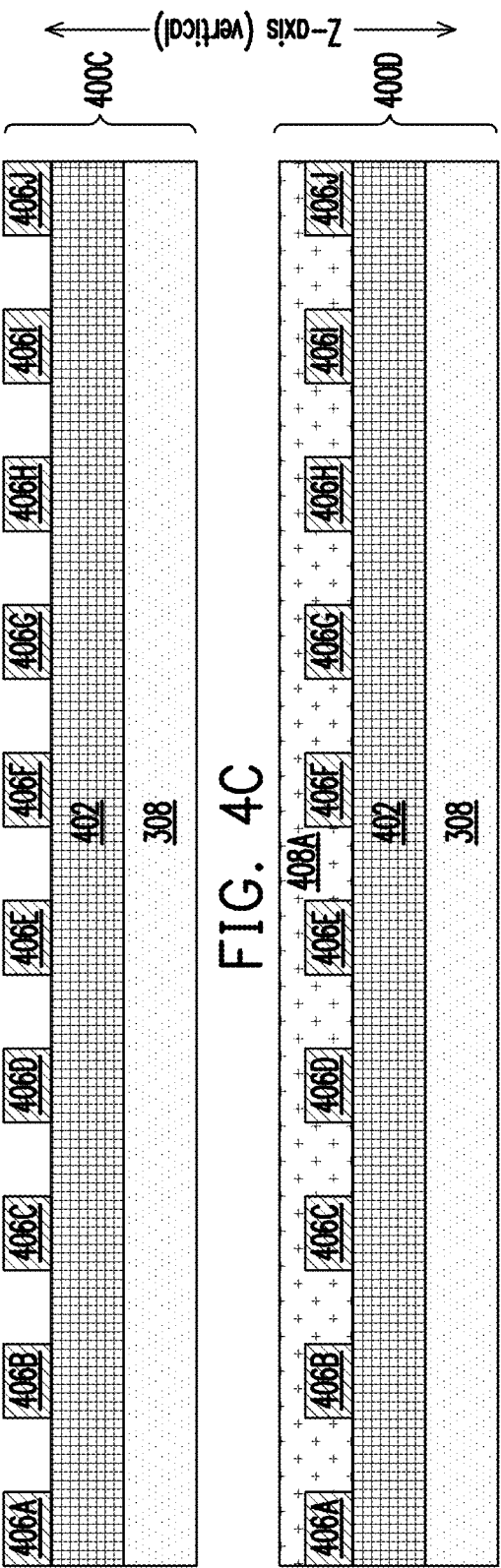
FIG. 4A
FIG. 4B
FIG. 4C
FIG. 4D

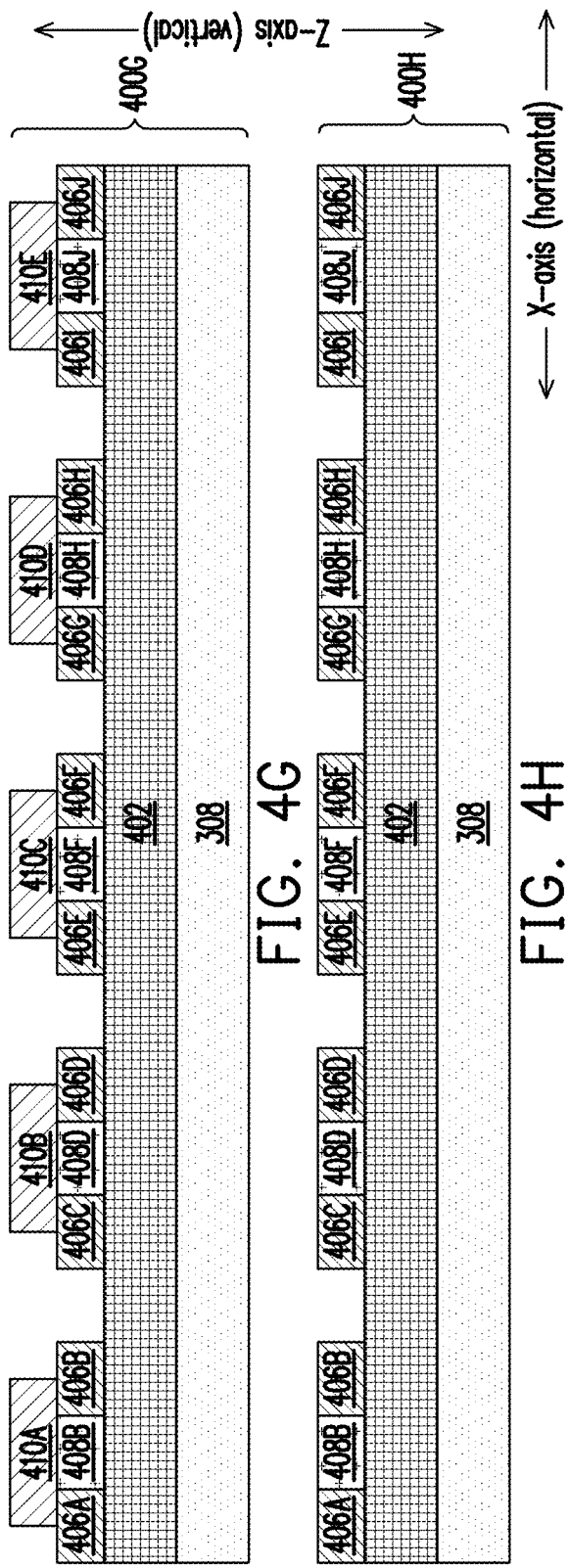

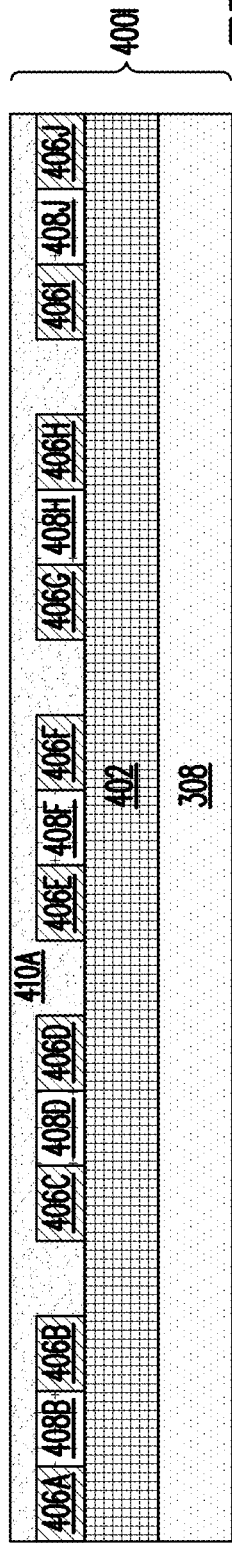
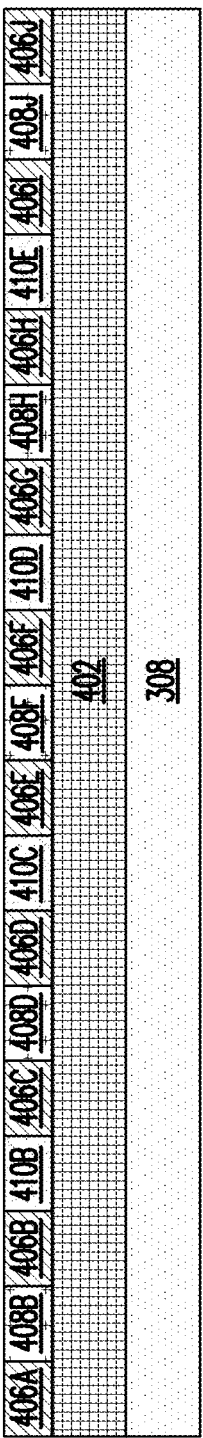
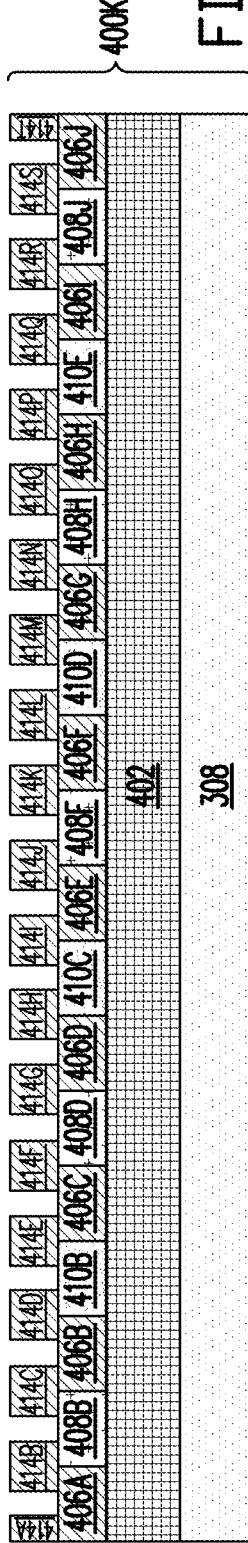
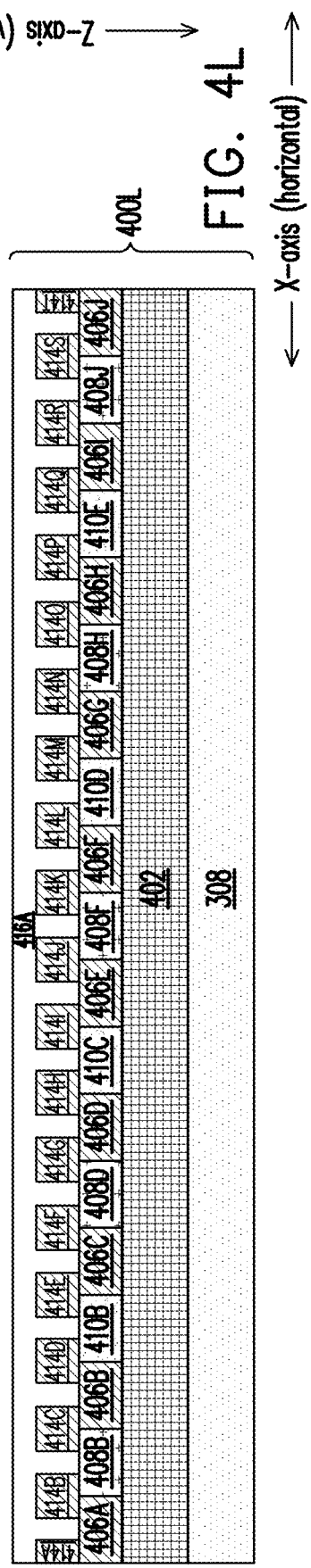
FIG. 4I
FIG. 4J
FIG. 4K
FIG. 4L

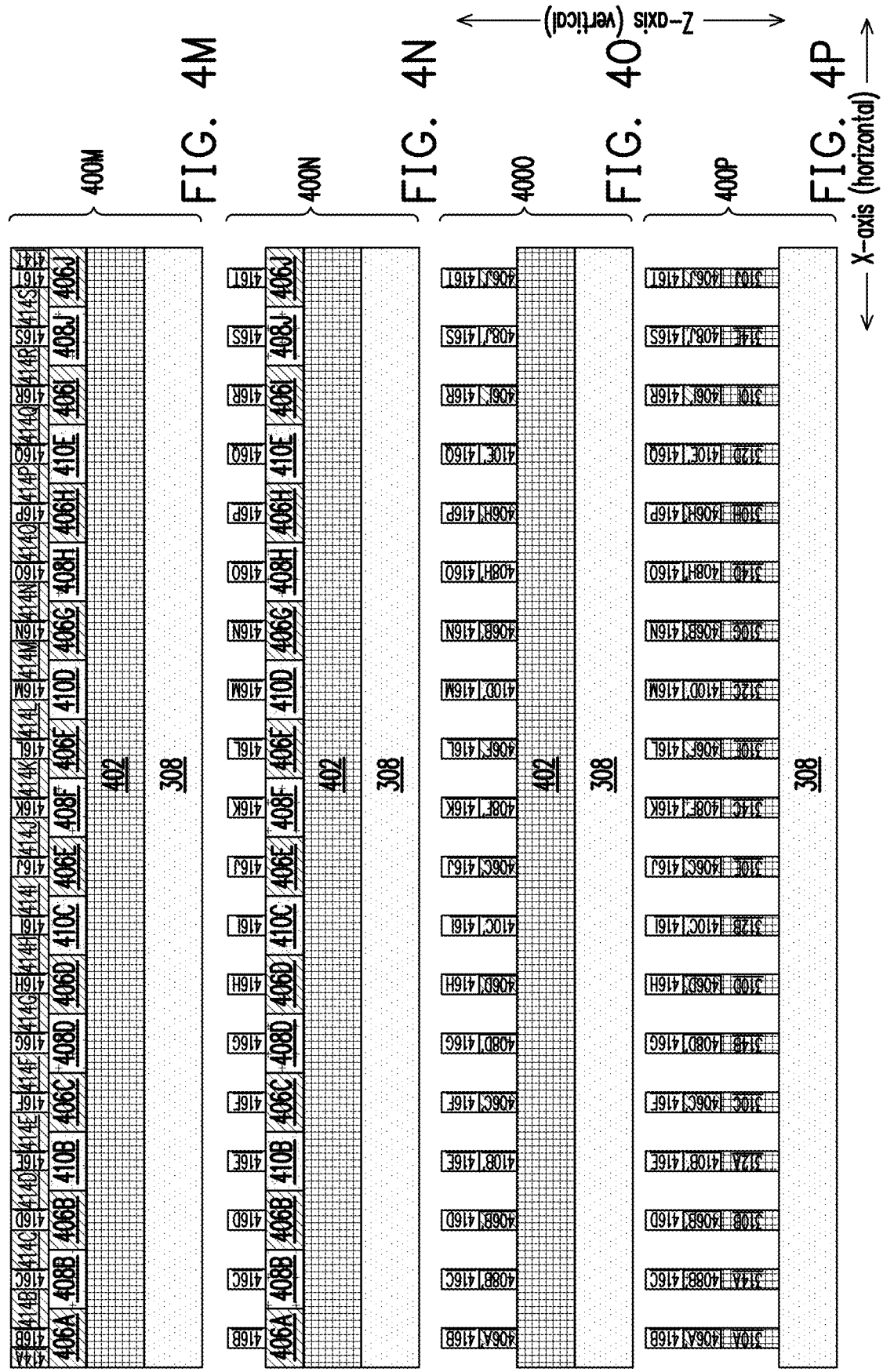

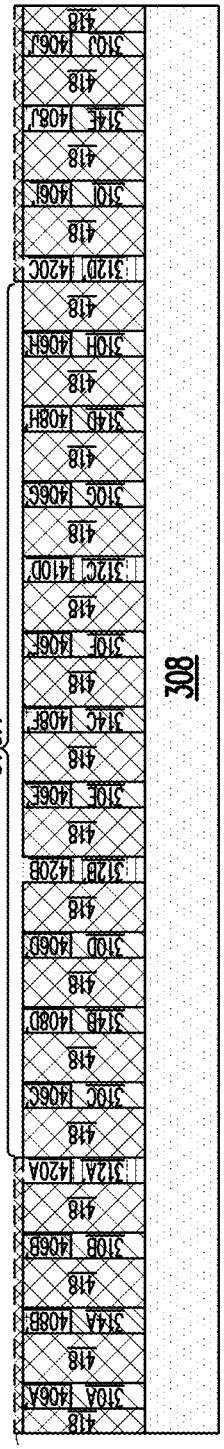

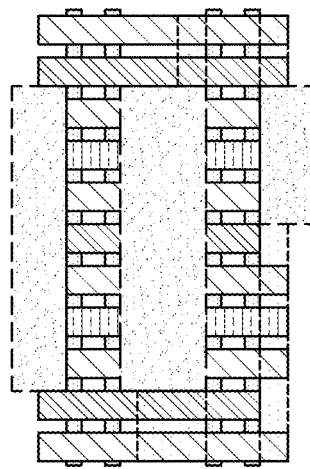
FIG. 5C
Or-And-Invert
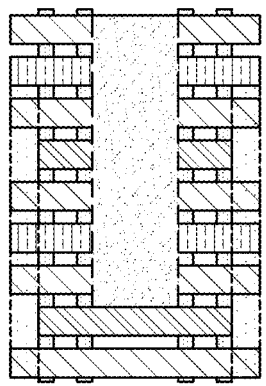
FIG. 5B
Buffer
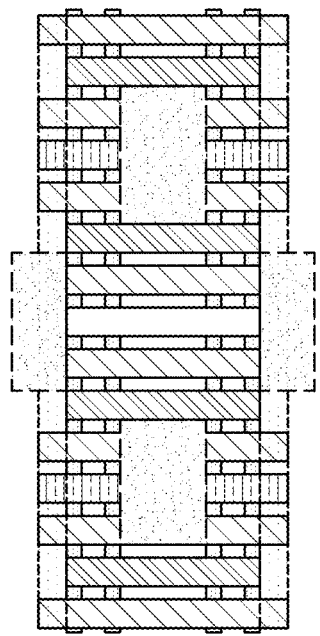
FIG. 5A
Multiplexer
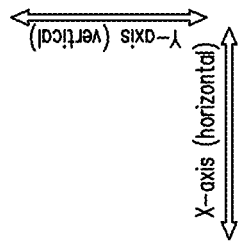

METHOD AND SYSTEM OF MANUFACTURING CONDUCTORS AND SEMICONDUCTOR DEVICE WHICH INCLUDES CONDUCTORS

PRIORITY CLAIM

The present application is a divisional of U.S. application Ser. No. 16/544,373, filed Aug. 19, 2019, now U.S. Pat. No. 10,978,439, issued Apr. 13, 2021, which is a divisional of U.S. application Ser. No. 15/676,225, filed Aug. 14, 2017, now U.S. Pat. No. 10,388,644, issued Aug. 20, 2019, which claims the priority of U.S. Provisional Application No. 62/427,570, filed Nov. 29, 2016, which are incorporated herein by reference in their entireties.

BACKGROUND

Photolithography techniques are used in the manufacture of integrated circuits. Due to the use of light in the exposure of photo resist, when two devices on the wafer are too close to each other, optical proximity effects occur. Optical proximity effects are due to light diffraction and interference between closely spaced features, resulting in the widths of lines in the lithographic image being affected by other nearby features. The proximity effects affect the process control in the formation of features, e.g., contacts such as gate electrodes and drain/source electrodes.

Double patterning is a technology developed for lithography to enhance feature density. Typically, for forming features of integrated circuits on wafers, lithography technology is used which involves applying a photo resist and defining patterns on the photo resist. The patterns in the patterned photo resist are first defined in a lithography mask, and are implemented either by the transparent portions or by the opaque portions in the lithography mask. The patterns in the photo resist are then transferred to the manufactured features.

With the increasing down-scaling of integrated circuits, the optical proximity effect posts an increasingly greater problem. When two separate features are too close to each other, the space and/or pitch between the features could be beyond the resolution limit of the light source. In accordance with double patterning technology, closely located features are separated into two masks of a same double-patterning mask set, with both masks used to pattern the layer. In each of the double-patterning masks, the distances between features are increased over the distances between features in a single mask, and hence, the resolution limit is overcome.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3J are plan-view layout diagrams of various stages in the manufacture of conductors for a semiconductor device in accordance with at least one embodiment of the present disclosure.

FIG. 5A is a plan-view layout diagram of conductors for a semiconductor device in accordance with at least one embodiment of the present disclosure.

FIG. 5B is a plan-view layout diagram of conductors for a semiconductor device in accordance with at least one embodiment of the present disclosure.

FIG. 5C is a plan-view layout diagram of conductors for a semiconductor device in accordance with at least one embodiment of the present disclosure.

DETAILED DESCRIPTION

Figure 1:
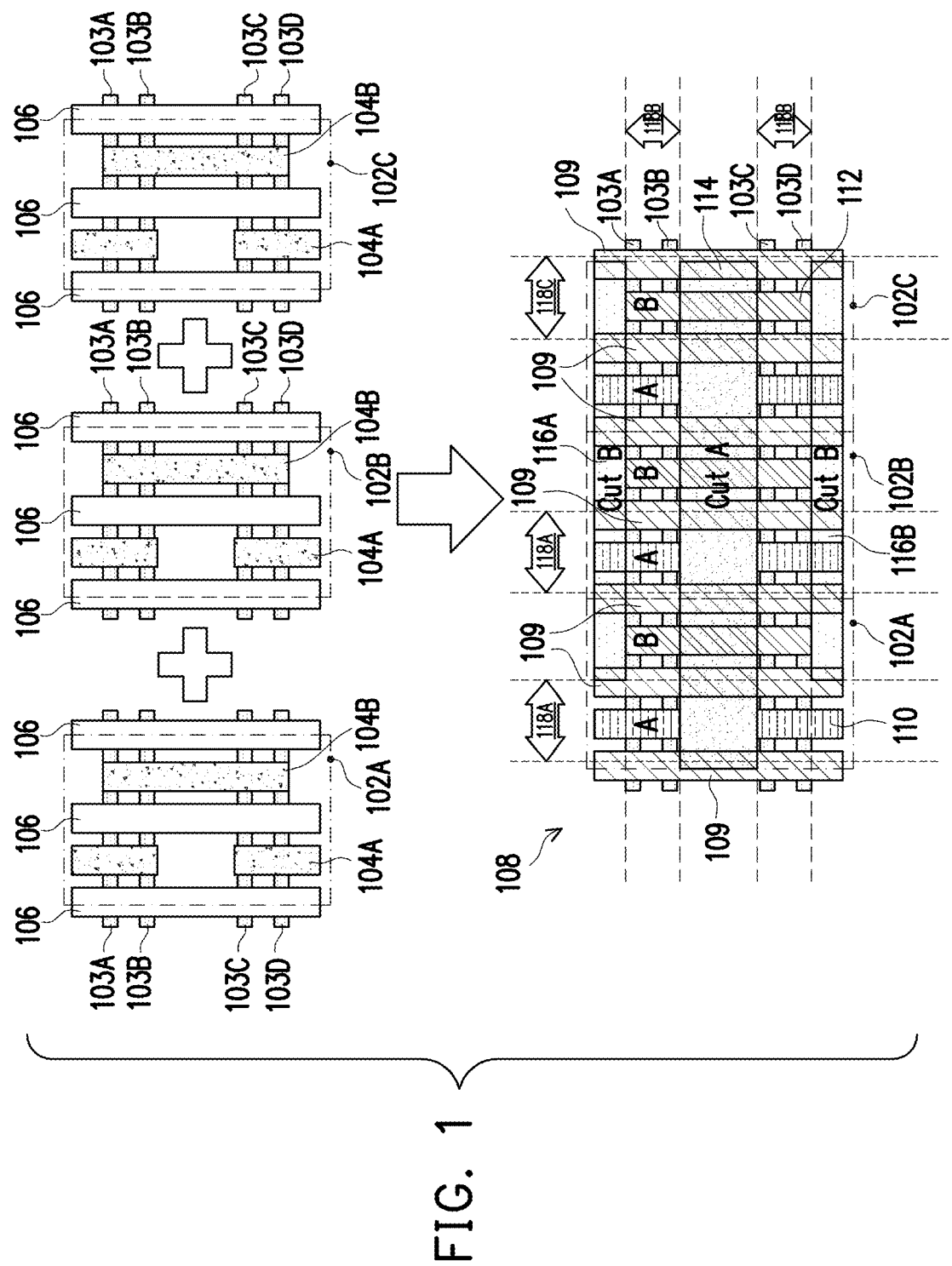
FIG. 1 is a layout diagram ("layout") which summarizes various stages in the manufacture of conductors for a semiconductor device in accordance with at least one embodiment of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure, in various embodiments, is generally related to manufacturing conductors for a semiconductor device. By capping parallel conductors with caps of different etch sensitivities, selected portions of parallel conductors in close proximity are removable (1) without violating layout design rules which require minimum width/horizontal separations between distinct cuts and minimum height/vertical separations between distinct cuts, and (2) without having to resort to (A) inserting dummy pitches/conductors and (B) increasing a minimum number of cuts (etching steps).

FIG. 1 is a layout diagram ("layout") which summarizes various stages in the manufacture of conductors for a semiconductor device in accordance with at least one embodiment of the present disclosure.

In FIG. 1, three layouts 102A, 102B and 102C are combined into a layout 108. In some embodiments, layouts 102A-102C are the same. In some embodiments, each of layouts 102A, 102B and 102C represents structures, including doped semiconductor structures and conductors, for an inverter circuit. In other embodiments, structures (including conductors) for other semiconductor devices are contemplated.

Layouts 102A, 102B and 102C each include: alpha conductors 104A and 104B, e.g., drain/source electrodes, arranged parallel to a first direction, e.g., the Y-axis (or vertical direction); parallel beta conductors (e.g., gate electrodes ("gates") 106 interspersed with corresponding alpha conductors 104A and 104B; and doped semiconductor structures 103A-103D arranged parallel to a second direction which is orthogonal to the first direction. For example, the second direction is parallel to the X-axis (or horizontal direction). In some embodiments, alpha conductors 104A and 104B and beta conductors 106 are the same material. In some embodiments, doped-semiconductor structures 103A-103D are transistor-channel structures. In some embodiments, doped-semiconductor structures 103A-103D are fins. In some embodiments, beta conductors 106 are gate electrodes. In some embodiments, for a given region including sections of one or more of fins 103A-103D, a corresponding one of gate electrodes 106 represents a component of a three-dimensional transistor having a fin or multi-fin structure (e.g., a Fin-FET).

Though not shown in FIG. 1, initially, alpha conductors 104A and 104B extended substantially the same length as beta conductors 106, with the phrase "substantially the same" being understood in the context of variations which result from manufacturing process-tolerances. If produced individually (not shown in FIG. 1), and in order to avoid design rule violations, portions of alpha conductors 104A and 104B subsequently would be selectively removed using two cuts (etching steps) to obtain layouts 102A, 102B and 102C.

If an attempt was made to combine layouts 102A-102C by simply overlapping layouts 102A-102C and then selectively removing portions of overlapping instances of beta conductors 106 in the same manner as could be done to each of layouts 102A-102C individually, then layout design rules would be violated. In particular, attempting to use only two cuts (etching steps) would not satisfy minimum width/horizontal separations between distinct cuts and/or minimum height/vertical separations between distinct cuts. To avoid the design rule violations, a prior approach attempted to combine layouts 102A-102C doing the following: inserting a dummy pitch/conductor in the form of an extra instance of an alpha conductor (e.g., of the same material as alpha conductors 104A and 104B) between beta conductors 106 at the edges adjoining layouts 102A and 102B and between beta conductors 106 at the edges adjoining layouts 102B and 102C; and using three cuts (etching steps) rather than two. The prior approach is disadvantageous because the two dummy pitches/conductors cannot be used in the resultant semiconductor device, and because an additional cut (etching step) is used.

By capping alpha conductors 104A-104B and beta conductors 106 with caps of different etch sensitivities, layouts 102A-102C can be combined into a layout 108 using two cuts (etching steps) and without inserting dummy pitches/conductors. To combine layouts 102A-102C as such, beta conductors 106 are covered with corresponding caps 109, alpha conductors 104A are covered with corresponding caps 110, and alpha conductors 104B are covered with corresponding caps 112. Because beta conductors 106 are covered with corresponding caps 109 in the lower portion of FIG. 1, caps 109 are shown with a different color and/or fill pattern than beta conductors 106 in the upper portion of FIG. 1. Because alpha conductors 104A are covered with corresponding caps 110 in the lower portion of FIG. 1, caps 110 are shown with a different color and/or fill pattern than alpha conductors 104A in the upper portion of FIG. 1. Because alpha conductors 104B are covered with corresponding caps 112, in the lower portion of FIG. 1, caps 112 are shown with a different color and/or fill pattern than alpha conductors 104B in the upper portion of FIG. 1.

Caps 109 have an etch sensitivity ES109, caps 110 have an etch sensitivity ES110 and caps 112 have an etch sensitivity ES112, where ES109≠ES110, ES109≠ES112 and ES110≠ES112. In particular, in satisfaction of design rules, layout 108 exhibits minimum width/horizontal separations 118A-118C between cut A 114 and corresponding instances 116A-116B of cuts B. Layout 108 also avoids violating minimum width/horizontal separations between distinct cuts for a given horizontal span because one instance 116A of cut B is used instead of multiple cuts.

Figure 2:
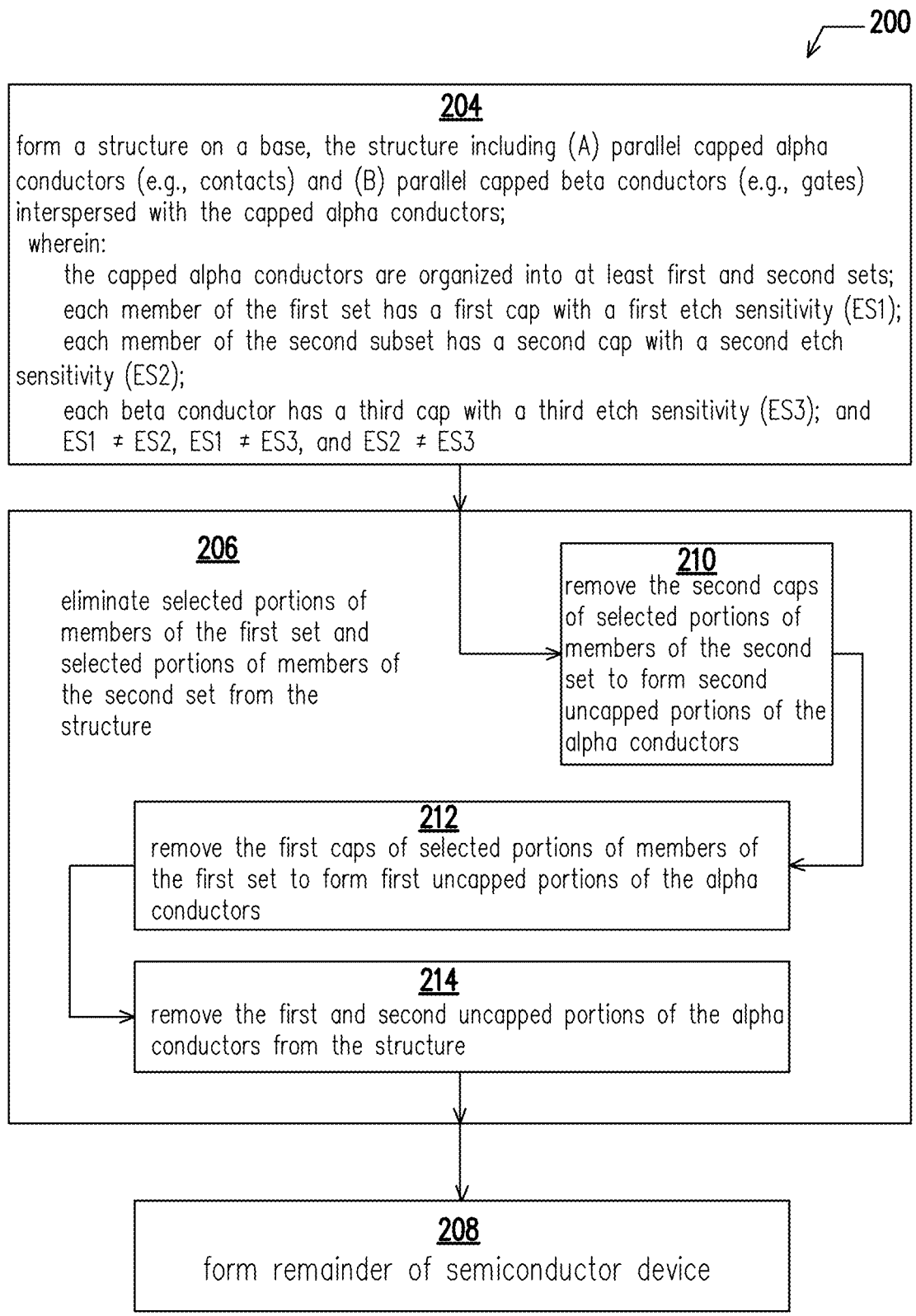
FIG. 2 is a flowchart of a method of manufacturing conductors for a semiconductor device in accordance with at least one embodiment of the present disclosure.

FIG. 2 is a flowchart of a method 200 of manufacturing conductors for a semiconductor device in accordance with at least one embodiment of the present disclosure. Additional operations can be provided before, during, and after the method 200. During the discussion of FIG. 2, references will be made to structures in FIG. 1A. Such a method is applicable to other structures.

In FIG. 2, at a block 204, a structure is formed on a base, the structure including: alpha conductors 104A (also see, e.g., 312A'-312D' and 314A-314E FIG. 3A) which are capped and arranged parallel to a first direction; and beta conductors 106 (also see, e.g., 310A-310V FIG. 3A) which are capped and arranged parallel to and interspersed with the capped alpha conductors 104A. In some embodiments, the base includes: a substrate; and a plurality of semiconductor fins 103A-103D arranged parallel to a second direction perpendicular to the first direction. In some embodiments, the alpha conductors are drain/source electrodes ("contacts") and the beta conductors are gate electrodes. In some embodiments, relative to a plan view, the second direction is the X-axis and the first direction is the Y-axis.

In some embodiments, the plurality of capped alpha conductors is organized into at least first (e.g., 312A'-312D' FIG. 3A) and second (e.g., 314A-314E FIG. 3A) sets. Each member of the first set of capped alpha conductors has a first cap (e.g., 410B'-410E' FIG. 4Q) with a first etch sensitivity, ES1. Each member of the second set of capped alpha conductors has a second cap (e.g., 408B', 408D', 408F' and 408H' FIG. 4Q) with a second etch sensitivity, ES2, the second etch sensitivity being different than the first etch sensitivity, ES1≠ES2. Each of the capped beta conductors has a third cap (406A'406J' FIG. 4Q) with a third etch sensitivity, ES3, the third etch sensitivity being different than the first and second etch sensitivities, ES3≠ES1 and ES3≠ES2. From block 204, flow proceeds to a block 206.

At block 206, selected portions (e.g., caps 410B', 410C' and 410E' in FIG. 4R resulting in gaps 420A, 420B and 420C in FIG. 4S) of members of the first set and selected portions (e.g., caps 408D', 408F' and 408H' in FIG. 4T resulting in corresponding gaps 422A, 422B and 422C in FIG. 4U) of members of the second set are eliminated from the structure. In some embodiments, the eliminated portions are selected based on the knowledge of the semiconductor device which is being manufactured. From block 206, flow proceeds to a block 208. Block 206 is implemented as blocks 210, 212 and 214.

At block 210, the second caps of selected portions (e.g., caps 408D', 408F' and 408H' in FIG. 4T resulting in corresponding gaps 422A, 422B and 422C in FIG. 4U) of members of the second set are removed to form second uncapped portions (e.g., 314B, 314C and 314D in FIG. 4U) of the alpha conductors. As a result, the second set is reduced to include only unselected members. From block 210, flow proceeds to block 212.

At block 212, the first caps of selected portions (e.g., caps 410B' 410C' and 410E' in FIG. 4R resulting in gaps 420A, 420B and 420C in FIG. 4S) of members of the first set are removed to form first uncapped portions of the alpha conductors. As a result, the first set is reduced to include only unselected members. From block 212, flow proceeds to block 214.

At block 214, the first (e.g., 312A', 312B' and 312D' FIG. 4U) and second (e.g., 314B, 314C and 314D in FIG. 4U) uncapped conductors, which correspond to the selected members of the first and second sets, are reduced in height. In some embodiments, as a result, residual conductors of negligible height remain. In some embodiments, no residual of the selected members of the first and second sets remains (e.g., resulting in gaps 420A', 420B', 420C', 422A', 422B' and 422C' in FIG. 4V). From block 214, flow proceeds to block 208.

At block 208, the remainder of the semiconductor device is formed. In some embodiments, forming the remainder of the semiconductor device includes forming Fin-FETs. In some embodiments, block 208 includes at least forming interconnections with corresponding beta conductors and corresponding unselected/remaining alpha conductors. In some embodiments, the semiconductor device is included in memory cells such as static random-access memory (SRAM) cells, magnetoresistive random-access memory (MRAM) cells, content-addressable memory (CAM), and the like. In some embodiments, the semiconductor device is included in input/output (I/O) devices, and the like. In some embodiments, the semiconductor device is included in high voltage devices, and the like.

FIGS. 3A-3J are plan-view layout diagrams of various stages in the manufacture of conductors for a semiconductor device in accordance with at least one embodiment of the present disclosure.

Figure 3D:
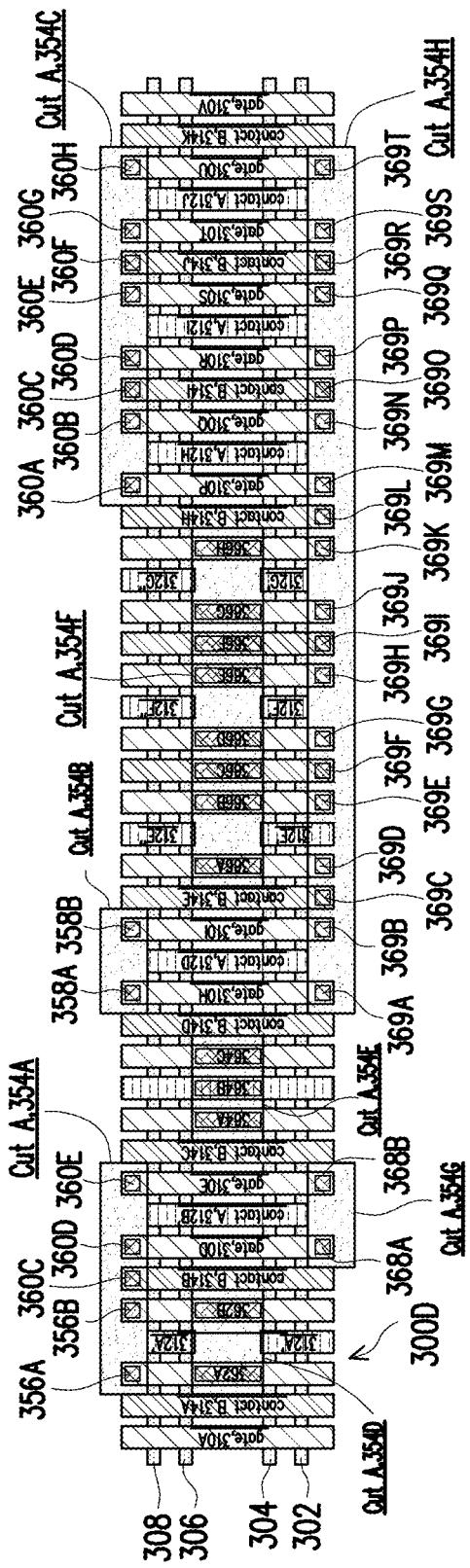
Figure 3E:
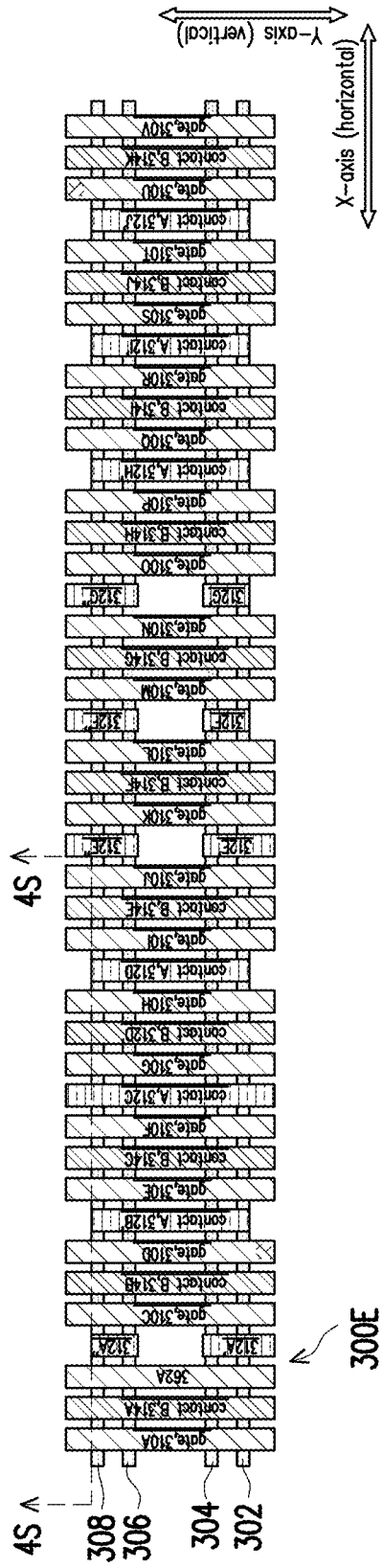
Figure 4Q:
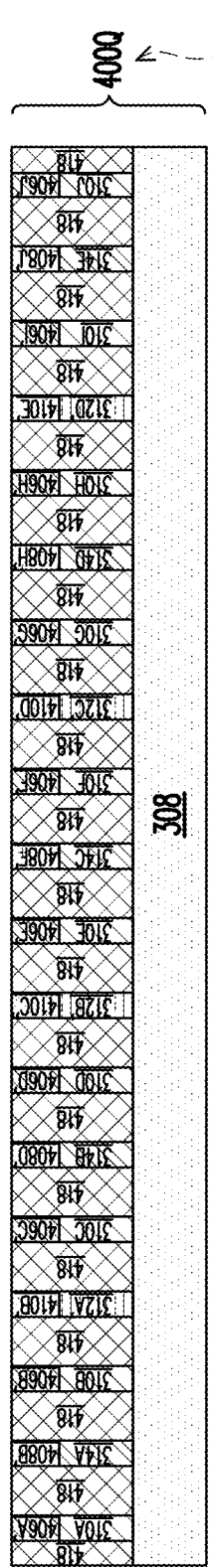
FIGS. 4A-4Z are cross-sections of various stages in the manufacture of conductors for the semiconductor device of FIGS. 3A-3J in accordance with at least one embodiment of the present disclosure.

FIGS. 4A-4U are cross-sections of various stages in the manufacture of conductors for the semiconductor device of FIGS. 3A-3J in accordance with at least one embodiment of the present disclosure. In particular, FIG. 4Q corresponds to FIG. 3A, FIG. 4R corresponds to FIG. 3C, FIG. 4S corresponds to FIG. 3E, FIG. 4T corresponds to FIG. 3G, and FIG. 4U corresponds to FIG. 3I. Accordingly, FIGS. 4Q-4Z will be discussed in the context of FIGS. 3A-3I. FIGS. 4A-4S are cross-sections of various stages in the manufacture of conductors which, in some embodiments, precede FIG. 4T.

Figure 4R:
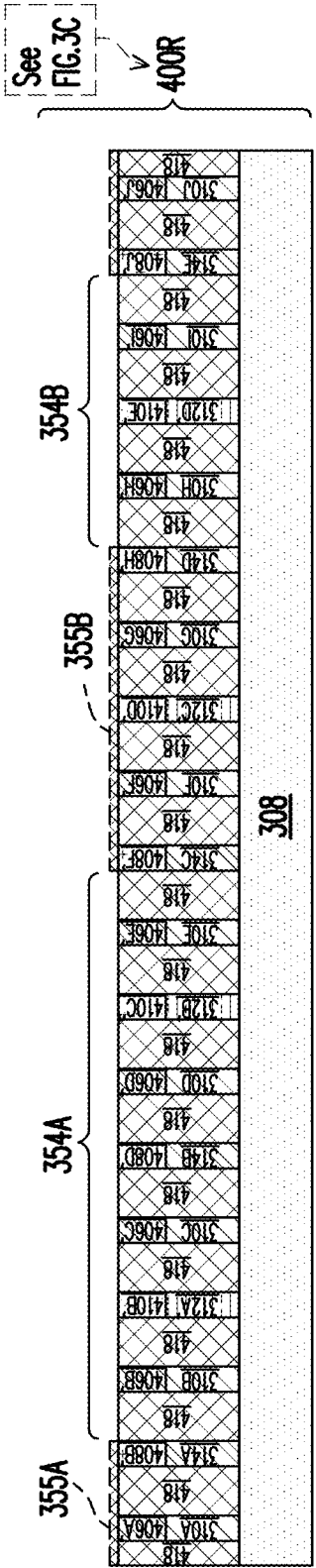
Figure 4S:
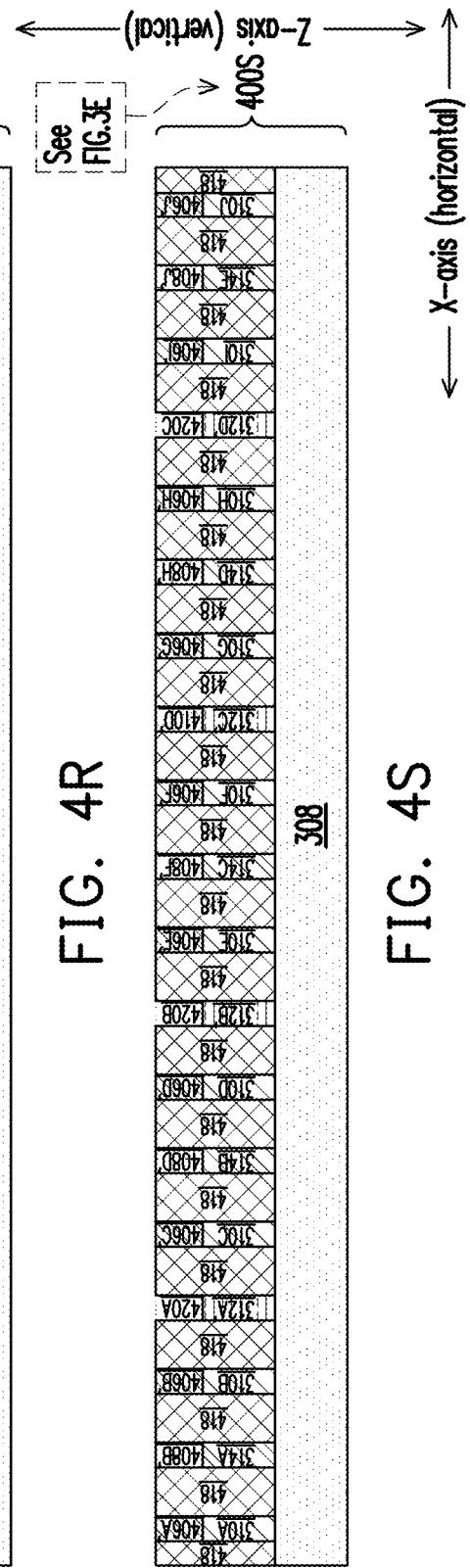
Figure 4X:
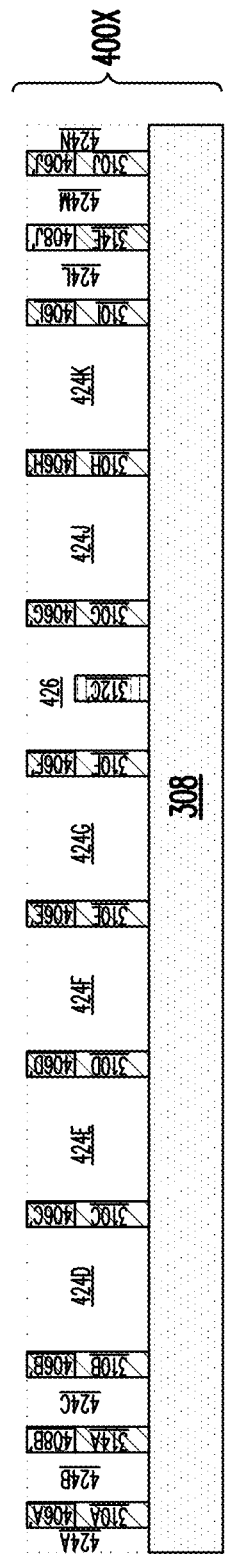
Figure 4Y:
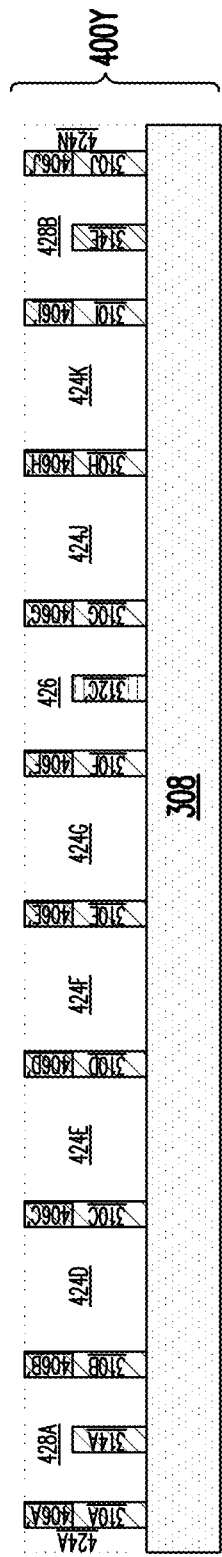
Figure 4Z:
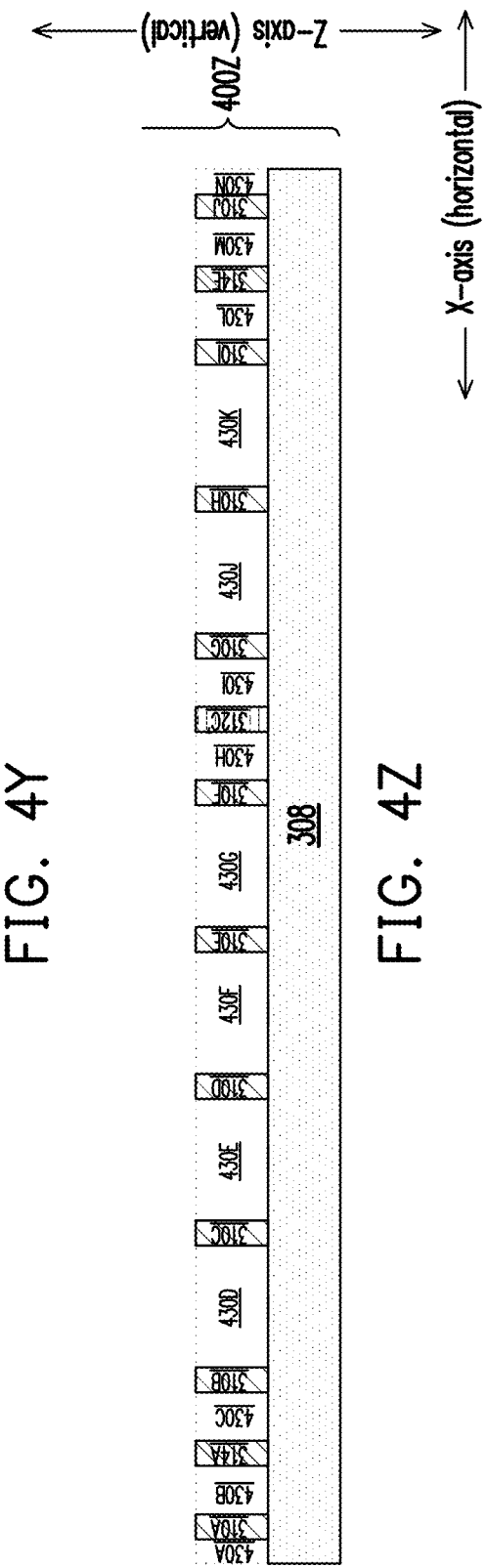

In some embodiments, the layouts of FIGS. 3A-3J and the cross-sections of FIGS. 4A-4Z represent structures, including conductors, for a semiconductor device which is a negative-edge-triggered clock latch circuit. In other embodiments, structures (including conductors) for other semiconductor devices are contemplated.

In FIG. 3A, layout 300A includes: rectangular doped-semiconductor structures 302-308; rectangular conductor structures 310A-310V; rectangular conductor structures 312A-312J; and rectangular conductor structures 314A-314K. In some embodiments, long axes of doped-semiconductor structures 302-308 are arranged parallel to a second direction, whereas long axes of conductors 310A-310V, 312A-312J and 314A-314K are arranged parallel to a first direction. In some embodiments, the second direction is the X-axis, which is shown as horizontal in FIGS. 3A-3J, while the first direction is the Y-axis, which is shown as vertical in FIGS. 3A-3J.

In some embodiments, conductors 312A-312J and 314A-314K are interspersed with conductors 310A-310V relative to the second direction. In some embodiments, between any two given instances of conductors 310A-310V, there will be one of conductors 312A-312J or one of conductors 314A-314K. For example, in the X-direction, conductor 314A is disposed between conductors 310A and 310B, conductor 312A is interspersed between conductor 310B and 310C, conductor 314B is disposed between conductors 310C and 310D, conductor 312B is disposed between conductors 310D and 310E, . . . conductor 312J is disposed between conductors 310T and 310U, and conductor 314K is disposed between conductors 310U and 310V. In some embodiments, a width in the X-direction of each of conductors 310A-310V, 312A-312J and 314A-314K is substantially the same, with the phrase "substantially the same" being understood in the context of variations which result from manufacturing process-tolerances. In some embodiments, a length in the Y-direction of each of conductors 310A-310V, 312A-312J and 314A-314K is substantially the same, with the phrase "substantially the same" being understood in the context of variations which result from manufacturing process-tolerances.

In some embodiments, doped-semiconductor structures 302-308 are fins, where fins are examples of transistor-channel structures. In some embodiments, doped-semiconductor structures 302-308 are fins for use in three-dimensional transistors having a fin or multi-fin structure (e.g., Fin-FETs). In some embodiments, conductors 310A-310V are gate electrodes and conductors 312A-312J and 314A-314K are drain/source electrodes ("contacts"). In some embodiments, gate electrodes 310A-310V are poly-silicon.

As noted, FIG. 4Q corresponds to FIG. 3A. More particularly, a conductor arrangement 400Q of FIG. 4Q corresponds to layout 300A of FIG. 3A. Because FIG. 4A is a cross-section of conductor arrangement 400Q, additional structures are shown in conductor arrangement 400Q of FIG. 4A relative to layout 300A of FIG. 3A.

In conductor arrangement 400Q, caps 406A'-406J' are formed on corresponding gates 310A-310J, caps 408B', 408D', 408F', 408H' and 408J' are formed on corresponding contacts 314A-314E, and caps 410B'-410E' are formed on corresponding contacts 312A'-312D'. Also in conductor arrangement 400Q, shallow trench isolation (STI) regions 418 fill gaps adjacent to stacked pairs of gates 310A-310J and corresponding caps 406A'-406J', gaps adjacent to stacked pairs of contacts 314A-314E and corresponding caps 408B', 408D', 408F', 408H' and 408J', and gaps adjacent to stacked pairs of contacts 312A'-312D' and corresponding caps 410B'-410E'. As examples: a STI region 418 is formed in the gap between a stacked pair of gate 310B and corresponding cap 406B' and a stacked pair of contact 312A' and corresponding cap 410B'; another STI region is formed between the stacked pair of contact 312A' and corresponding cap 410B' and a stacked pair of gate 310C and corresponding cap 406C'; another STI region is formed between the stacked pair of gate 310C and corresponding cap 406C' and a stacked pair of contact 314B and corresponding cap 408D'; another STI region 418 is formed between the stacked pair of contact 314B and corresponding cap 408D' and a stacked pair of gate 310D and corresponding cap 406D'; and so on.

In some embodiments, caps 410B'-410E' have a first etch sensitivity ES410, caps 408B'-408J' have a second etch sensitivity ES408, and caps 406A'-406J' have a third etch sensitivity ES406, where ES410, ES408 and ES406 are different from each other. In some embodiments, gates 310A-310J are poly-silicon, with an etch sensitivity ES(poly), which is different than each of ES410, ES408 and ES406.

In FIG. 3B, instances 354A-354H of a first cut, cut A, are shown as overlaid onto layout 300A, resulting in a layout 300B. In some embodiments, a cut is not a physical structure, but instead is the result of having subjected material exposed by an opening in a hard mask to an etchant. FIG. 3C shows instances 354A-354H of cut A in the context of a hard mask 355, i.e., shows instances 354A-354H of cut A as openings in hard mask 355.

As noted, FIG. 4R corresponds to FIG. 3C. More particularly, a conductor arrangement 400R of FIG. 4R corresponds to layout 300C of FIG. 3C.

In FIG. 4R, a portion 355A of hard mask 355 (mask portion 355A) covers caps 406A' and 408B' and corresponding STI regions 418. A portion 355B of hard mask 355 (mask portion 355B) covers cap 410D'. Because of photolithographic resolution-limitations, portion 355B of hard mask 355 is extended beyond cap 410D' to also cover caps 408F', 406F', 406G' and 408H' and corresponding STI regions 418. In addition, a portion 355C of hard mask 355 (mask portion 355C) covers caps 408J' and 406J' and corresponding STI regions 418. Cut/opening 345A exposes caps 410B' and 410C'. Similarly, because of photolithographic resolution-limitations, cut/opening 354A is extended beyond caps 410B' and 410C' to also expose caps 406B', 406C', 408D', 406D' and 406E' and corresponding STI regions 418 are exposed by cut/opening 354A. Cut/opening 345B exposes cap 410E'. Similarly, because of photolithographic resolution-limitations, cut/opening 354B is extended beyond cap 410E' to also expose caps 406H' and 406I' and corresponding STI regions 418.

FIG. 3D shows that instances 354A-354H of cut A selectively remove portions of contacts 312A-312J resulting in a layout 300D, which includes contacts 312A', 312A", 314A, 312D', 312E' and 312E", 312F', 312F", 312G', 312G", 312H', 312I' and 312J'. Relative to FIG. 4R, the etchant applied during cut A is appropriate to (or is selective for) the etch sensitivity of caps 410B'-410E', namely ES410. Though exposed by instance 354A of cut A to the ES410-appropriate etchant, caps 406B'-406E' on gates 310B-310E and cap 408D' on contact 314B are substantially unaffected because of their corresponding different etch sensitivities ES406 and ES408. Here, terminology used in the science of immunology is adapted to describe FIG. 3D such that, in effect, caps 406B'-406E' and 408D' can be described as 'immunizing' corresponding gates 310B-310E and contact 314B from the damaging effects of the ES410-appropriate etchant. In FIG. 3D, areas within instance 354A of cut A in which caps 406B'-406E' and cap 408D' provide 'immunization' with respect to the ES410-appropriate etchant are indicated by corresponding immunization areas 356A-356E. Also, though exposed by instance 354B of cut A to the ES410-appropriate etchant, caps 406H'-406I' on gates 310H-310I are substantially unaffected because of their corresponding different etch sensitivity ES406. Similarly, in effect, caps 406H'-406I' immunize corresponding gates 310H-310I from the damaging effects of the ES410-appropriate etchant. In FIG. 3D, areas within instance 354B of cut A in which caps 406H'-406I' provide 'immunization' with respect to the ES410-appropriate etchant are as indicated by corresponding immunization areas 358A-358B. Furthermore, immunization areas 360A-360H are indicated within instance 354C of cut A, immunization areas 362A-362B are indicated within instance 354D of cut A, immunization areas 366A-366H are indicated within instance 354F of cut A, immunization areas 368A-368B are indicated within instance 354G of cut A, and immunization areas 369A-369T are indicated within instance 354H of cut A.

Similarly, in FIG. 3D, immunization areas 360A-360H are indicated for instance 354C of cut A. Immunization areas 362A-362B are indicated for instance 354D of cut A. Immunization areas 364A-364C are indicated for instance 354E of cut A. Immunization areas 366A-366H are indicated for instance 354F of cut A. Immunization areas 368A-368B are indicated for instance 354G of cut A. And immunization areas 369A-369T are indicated for instance 354H of cut A.

FIG. 3E is a layout 300E which is a simplified version layout 300D of FIG. 3D, and in which it is easier to see the resultant contacts 312A', 312A", 314A, 312C, 312D', 312E' and 312E", 312F', 312F", 312G', 312G", 312H', 312I' and 312J'. As noted, FIG. 4S corresponds to FIG. 3E. More particularly, a conductor arrangement 400S of FIG. 4S corresponds to layout 300E of FIG. 3E. In FIG. 4S, the ES410-appropriate etchant has removed caps 410B', 410C' and 410E', resulting in corresponding gaps 420A-420C which expose contacts 312A', 312B' and 312D'.

In FIG. 3F, instances 370A-370G of a second cut, cut B, are shown as overlaid onto layout 300E of FIG. 3E, resulting in a layout 300F. FIG. 3G is a layout 300G which shows instances 370A-370G of cut B of FIG. 3F albeit in the context of a hard mask 371, i.e., shows instances 370A-370G of cut B as openings in hard mask 371.

As noted, FIG. 4T corresponds to FIG. 3F. More particularly, a conductor arrangement 400T of FIG. 4T corresponds to layout 300F of FIG. 3F.

In FIG. 4T, a portion 371A of hard mask 371 covers cap 408B'. Because of photolithographic resolution-limitations, portion 371A of hard mask 371 is extended beyond cap 408B' to also cover caps 406A'-406B' and corresponding STI regions 418. A portion 371B of hard mask 371 covers cap 408F. Similarly, because of photolithographic resolution-limitations, portion 371B of hard mask 371 is extended beyond cap 408J' to also cover caps 406I'-406J' and corresponding STI regions 418. Cut/opening 370A exposes caps 408D', 408F' and 408H'. Similarly, because of photolithographic resolution-limitations, cut/opening 370A is extended beyond caps 408D', 408F' and 408H' to also expose caps 406C'-406H' and 410D' and corresponding STI regions 418.

FIG. 3H is a layout 300H which shows that instances 370A-370G of cut B selectively remove portions of contacts 314A-314K resulting in contacts 314A', 314A", 314B', 314B", 314C', 314C", 314D', 314E', 314E", 314F', 314G', 314G", 314H', 314H", 314I', 314I", 314J', 314J", 314K' and 314K". Relative to FIG. 4T, the etchant applied during cut B is appropriate to the etch sensitivity of caps 408D', 408F' and 408H', namely ES408. Though exposed by instance 370A of cut B to the ES408-appropriate etchant, caps 406C'-406H' on gates 310C-310H and cap 410D' on contact 312C' are substantially unaffected because of their corresponding different etch sensitivities ES406 and ES(poly). In effect, caps 406C'-406H' and cap 410D' can be described as 'immunizing' corresponding gates 310C-310H and contact 312C' from the damaging effects of the ES408-appropriate etchant. In FIG. 3H, areas within instance 370A of cut B in which caps 406C'-406H' and cap 410D' provide 'immunization' with respect to the ES408-appropriate etchant are indicated by corresponding 'immunization' areas 372A-372G. Furthermore, immunization areas 374A-374H are indicated within instance 370B of cut B, immunization areas 376A-376G are indicated within instance 370C of cut B, immunization areas 378A-378B are indicated within instance 370D of cut B, immunization areas 380A-380M are indicated within instance 370E of cut B, immunization areas 382A-382I are indicated within instance 370F of cut B, and immunization areas 384A-384B are indicated within instance 370G of cut B.

Similarly, in FIG. 3H, immunization areas 374A-374H are indicated for instance 370B of cut B. Immunization areas 376A-376G are indicated for instance 370C of cut B. Immunization areas 378A-378B are indicated for instance 370D of cut B. Immunization areas 380A-380M are indicated for instance 370E of cut B. Immunization areas 382A-382I are indicated for instance 370F of cut B. And immunization areas 384A-384B are indicated for instance of 370G of cut B.

FIG. 3I is a layout 300I, which is a simplified version of layout 300H of FIG. 3H, and in which it is easier to see the resultant contacts 314A', 314A", 314B', 314B", 314C', 314C", 314D', 314E', 314E", 314F', 314G', 314G", 314H', 314H", 314I', 314I", 314J', 314J", 314K' and 314K". As noted, FIG. 4U corresponds to FIG. 3I. More particularly, a conductor arrangement 400U of FIG. 4U corresponds to layout 300I of FIG. 3I. In FIG. 4U, the ES408-appropriate etchant has removed caps 408D', 408F' and 408H', resulting in corresponding gaps 422A-422C which expose contacts 314B, 314C and 314D.

FIG. 3J is a layout 300J, which is a combination of FIGS. 3B and 3F albeit without the numbering of structures found in FIGS. 3B and 3F. As such, FIG. 3J shows instances cut A (see FIG. 3B) as well as cut B (see FIG. 3F) overlaid onto layout 300A, which thereby shows where corresponding instances of cut A and cut B overlap.

In FIG. 4V, an etchant appropriate to etch sensitivity ES(poly) has been applied to conductor arrangement 400U, which removes exposed contacts 312A, 312B, 312C, 312D, 314B, 314C and 314D, resulting in a conductor arrangement 400V which has gaps 420A'-420C' and 422A'-422C' over corresponding exposed portions of fin 308. Though exposed to the ES(poly)-appropriate etchant, caps 406A'-406J' on gates 310A-310J, caps 408B' and 408J' on corresponding contacts 314A and 314E, cap 410D' on contact 312C' and fin 308 are substantially unaffected because of their corresponding different etch sensitivities ES406, ES408, ES410 and ES308.

In FIG. 4W, STI regions 418 are removed from conductor arrangement 400V, resulting in a conductor arrangement 400W, which has gaps 424A-424N. In some embodiments, STI regions 418 are removed using a wet dip. In some embodiments, the wet dip is a diluted hydrofluoric (HF) acid solution. In some embodiments, STI regions 418 are removed using dry etching. Though exposed to the ES(STI)-appropriate etchant, caps 406A'-406J' on gates 310A-310J, caps 408B' and 408J' on corresponding contacts 314A and 314E, cap 410D' on contact 312C' and fin 308 are substantially unaffected because of their corresponding different etch sensitivities ES406, ES408, ES410 and ES308.

In FIG. 4X, cap 410D' is removed from conductor arrangement 400W, resulting in a conductor arrangement 400X, which has a gap 426. In effect, gap 426 represents an expansion and combination of gaps 424H-424I. Though exposed to the ES410-appropriate etchant, caps 406A'-406J' on gates 310A-310J, caps 408B' and 408J' on corresponding contacts 314A and 314E and fin 308 are substantially unaffected because of their corresponding different etch sensitivities ES406, ES408 and ES308.

In FIG. 4Y, caps 408B' and 408J' are removed from conductor arrangement 400X, resulting in a conductor arrangement 400Y, which has gaps 428A-428B. In effect, gap 428A represents an expansion and combination of gaps 424B-424C, whereas gap 428B represents an expansion and combination of gaps 424L-424M. Though exposed to the ES408-appropriate etchant, caps 406A'-406J' on gates 310A-310J and fin 308 are substantially unaffected because of their corresponding different etch sensitivities ES406 and ES308.

In FIG. 4Z, caps 406A'-406J' are removed from conductor arrangement 400Y, resulting in a conductor arrangement 400Z, which has gaps 430A-430N. Though exposed to the ES406-appropriate etchant, fin 308 is substantially unaffected because of its corresponding different etch sensitivity ES308.

In FIG. 4A, first mandrel features 404A-404H are built in selected areas on a layer 402, with layer 402 being built on a base that includes fins 308 built on a substrate. Portions other than fin 308 of the base are not shown in FIGS. 4A-4Z. Eventually, remnants of layer 402 will become gates 310A-310J, contacts 314A-314E and contacts 312A'-312D' of FIG. 4Q.

In some embodiments, layer 402 is poly-silicon. In some embodiments, fin 308 is a doped semiconductor material. In some embodiments, the substrate is silicon, e.g., a silicon wafer. In some embodiments, the substrate is amorphous silicon (a-Si). The substrate may be formed by a variety of processes. In some embodiments, a dielectric layer (now shown) is formed between layer 402 and fin 308. Eventually, remnants of such a dielectric layer will become gate insulators remain under gates 310A-310J. For simplicity of illustration, such a dielectric (and the remnants of such a dielectric) are not shown.

In some embodiments, first mandrel features 404A-404H are built in a layer of negative or positive photoresistive material using a photolithography process, resulting in an arrangement 400A. In some embodiments, first mandrel features 404A-404H are built by spin-coating a negative photoresist layer over the base including fin 308, soft baking the photoresist layer, exposing the photoresist layer to light (e.g., a deep ultraviolet (DUV) light) using a mask. Then the exposed photoresist layer is subjected to post-exposure baking (PEB), developing, and hard baking thereby removing unexposed portions of the photoresist layer and leaving exposed portions of the photoresist layer on the base including fin 308 as first mandrel features 404A-404H. In some embodiments, first mandrel features 404A-404H are built by unexposed portions of a positive resist material layer in a similar photolithography process. In some embodiments, first mandrel features 404A-404H are evenly distributed in a reference direction parallel to a plane of the base, e.g., in a horizontal direction parallel to the X-axis. The patterned photoresist layer is removed thereafter using a suitable process, such as wet stripping or plasma ashing. In some embodiments, the etching process includes applying a dry (or plasma) etch to remove the one or more dielectric layers within the openings of the patterned photoresist layer.

In FIG. 4B, on exposed areas of layer 402, first spacers 406A-406J are built on the base including fin 308, resulting in an arrangement 400B.

First spacers 406A-406J abut sidewalls of first mandrel features 404A-404H. First spacers 406A-406J include one or more materials which are different from the material from which first mandrel features 404A-404H are built. First spacers 406A-406J have an etch sensitivity, ES406. In some embodiments, first spacers 406A-406J include a dielectric material, such as titanium nitride, silicon nitride, titanium oxide or other suitable material. In some embodiments, other material suitable for first spacers 406A-406J include, but are not limited to, poly-silicon, SiO2, Si3N4, SiON, TEOS, nitrogen-containing oxide, nitride oxide, high K material (K>5), or combinations thereof. In some embodiments, first spacers 406A-406J are built by various processes, including a deposition process and an etching process. In some embodiments, the deposition process includes a chemical vapor deposition (CVD) process, a physical vapor deposition (PVD) process or another suitable process. In some embodiments, first spacers 406A-406J are built by CVD using chemicals including Hexachlorodisilane (HCD or Si2Cl6), Dichlorosilane (DCS or SiH2Cl2), Bis(Tertiary-ButylAmino) Silane (BTBAS or C8H22N2Si) and/or Disilane (DS or Si2H6). In some embodiments, first spacers 406A-406J are silicon oxide formed by thermal oxidation. In some embodiments, first spacers 406A-406J are SiN formed by chemical vapor deposition (CVD).

In FIG. 4C, first mandrel features 404A-404H are removed, which leaves regions on layer 402 exposed and results in arrangement 400C.

In some embodiments, first mandrel features 404A-404H are removed by an etching process tuned to remove the material from which first mandrel features 404A-404H are built but not first spacers 406A-406J, nor layer 402. In some embodiments, the etching process is a wet etching, a dry etching, or a combination thereof. First spacers 406A-406J are used as hard masks during subsequent etching processes.

In FIG. 4D, a layer 408A of etch stop material is deposited on first spacers 406A-406J and the exposed regions of layer 402, which results in arrangement 400D.

In some embodiments, layer 408A is formed of silicon nitride, e.g., using low-pressure chemical vapor deposition (LPCVD). In some embodiments, layer 408A is formed by thermal nitridation of silicon, plasma enhanced chemical vapor deposition (PECVD), plasma anodic nitridation or another suitable process. In some embodiments, layer 408A includes multiple layers of material to gain process flexibility. In some embodiments, layer 408A includes a first oxide layer deposited on first spacers 406A-406J and the exposed regions of layer 402, a silicon nitride layer deposited on the first oxide layer, and a second silicon oxide layer deposited on the silicon nitride layer. In some embodiments, the one or more layers comprising layer 408A are formed by thermal oxidation, a chemical vapor deposition (CVD) process, plasma enhanced CVD (PECVD) and/or atomic layer deposition (ALD).

In FIG. 4E, a portion of layer 408A is removed, which leaves etch stop layer (ESL) portions 408B-408J on layer 402, and results in arrangement 400E.

ESL portions 408B-408J abut sidewalls of corresponding first spacers 406A-406J. ESL portions 408B-408J have an etch sensitivity ES408, etch sensitivity ES408 being different than etch sensitivity ES406. In some embodiments, the portion of layer 408A is removed using chemical mechanical polishing (CMP). In some embodiments, the CMP produces an approximately planar surface. In some embodiments, relative to the reference direction: widths of first spacers 406A-406J and ESL portions 408B-408J are substantially the same, with the phrase "substantially the same" being understood in the context of variations which result from manufacturing process-tolerances. ESL portions 408B-408J are used as hard masks during subsequent etching processes.

In FIG. 4F, second mandrel features 410A-410E are built on areas of first spacers 406A-406J and ESL portions 408B-408J, which results in arrangement 400F. In arrangement 400F, some regions of first spacers 406A-406J and ESL portions 408B-408J are left exposed.

In some embodiments, second mandrel features 410A-410E are centered over corresponding alternating ones of ESL portions 408B-408J such that each instance of second mandrel features 410A-410E extends approximately halfway across adjacent corresponding instances of first spacers 406A-406J. In FIG. 4F, ESL portions 408C, 408E, 408G and 408I are left uncovered by second mandrel features 410A-410E. In some embodiments, second mandrel features 410A-410E are built in a manner similar to how first mandrel features 404A-404H are built.

In FIG. 4G, ESL portions 408C, 408E, 408G and 408I are removed, which results in arrangement 400G. In arrangement 400G, regions of layer 402 are exposed.

In some embodiments, ESL portions 408C, 408E, 408G and 408I are removed by an etching process tuned to remove the material from which ESL portions 408C, 408E, 408G and 408I are built but not first spacers 406A-406J, nor layer 402. In some embodiments, the etching process is a wet etching, a dry etching, or a combination thereof.

In FIG. 4H, second mandrel features 410A-410E are removed, which leaves first spacers 406A-406J and ESL portions 408B, 408D, 408F, 408H and 408J exposed and results in arrangement 400H.

In some embodiments, second mandrel features 410A-410E are removed by an etching process tuned to remove the material from which second mandrel features 410A-410E are built but not first spacers 406A-406J, ESL portions 408B, 408D, 408F, 408H and 408J nor layer 402. In some embodiments, the etching process is a wet etching, a dry etching, or a combination thereof.

In FIG. 4I, a layer 410A of another etch stop material is deposited on first spacers 406A-406J, ESL portions 408B, 408D, 408F, 408H and 408J, and the exposed regions of layer 402, which results in arrangement 400I.

Layer 410a is of a different etch stop material than portions 408B, 408D, 408F, 408H and 408J. In some embodiments, layer 408A is formed of silicon nitride, e.g., using low-pressure chemical vapor deposition (LPCVD). In some embodiments, layer 410A is formed by thermal nitridation of silicon, plasma enhanced chemical vapor deposition (PECVD), plasma anodic nitridation or another suitable process. In some embodiments, layer 410A includes multiple layers of material to gain process flexibility. In some embodiments, layer 410A includes a first oxide layer deposited on first spacers 406A-406J, ESL portions 408B, 408D, 408F, 408H and 408J, and the exposed regions of layer 402, a silicon nitride layer deposited on the first oxide layer, and a second silicon oxide layer deposited on the silicon nitride layer. In some embodiments, the one or more layers comprising layer 410A are formed by thermal oxidation, a chemical vapor deposition (CVD) process, plasma enhanced CVD (PECVD) and/or atomic layer deposition (ALD).

In FIG. 4J, a portion of layer 410A is removed, which leaves etch stop layer (ESL) portions 410B, 410C, 410D and 410E on layer 402, and results in arrangement 400J. Together, interspersed ESL portions 410B, 410C, 410D & 410E, first spacers 406A-406J, and ESL portions 408B, 408D, 408F, 408H & 408J represent an intermediate layer formed on layer 402.

ESL portions 410B-410E abut sidewalls of corresponding first spacers 406A-406J. ESL portions 410B-410E have an etch sensitivity ES410, etch sensitivity ES410 being different than etch sensitivities ES406 and ES408. In some embodiments, the portion of layer 410A is removed using chemical mechanical polishing (CMP). In some embodiments, the CMP produces an approximately planar surface. In some embodiments, relative to the reference direction: widths of first spacers 406A-406J, ESL portions 408B, 408D, 408F, 408H and 408J, and ESL portions 410B-410E are substantially the same, with the adjective "substantially the same" being understood in the context of variations which result from manufacturing process-tolerances. ESL portions 410B-410E are used as hard masks during subsequent etching processes.

In FIG. 4K, third mandrel features 414A-414T are built on areas of first spacers 406A-406J, ESL portions 408B, 408D, 408F, 408H and 408J, and ESL portions 410B-410E, which results in arrangement 400K. In arrangement 400K, middle regions of first spacers 406A-406J, ESL portions 408B, 408D, 408F, 408H and 408J, and ESL portions 410B-410E, are left exposed.

In some embodiments, third mandrel features 414A-414T are centered over edges of abutting first pairs of a given one of first spacers 406A-406J and a corresponding one of ESL portions 408B-408J and over edges of abutting first pairs of a given one of first spacers 406A-406J and a corresponding one of ESL portions 410B-410E. In some embodiments, third mandrel features 414A-414T are built in a manner similar to how first mandrel features 404A-404H are built.

In FIG. 4L, a layer 416A of another etch stop material is deposited on third mandrel features 414A-414T and exposed portions of first spacers 406A-406J, ESL portions 408B, 408D, 408F, 408H and 408J, and ESL portions 410B-410E, which results in arrangement 400L.

Layer 416A is of a different etch stop material than portions 408B, 408D, 408F, 408H and 408J and portions 410B-410E. In some embodiments, layer 416A is formed of silicon nitride, e.g., using low-pressure chemical vapor deposition (LPCVD). In some embodiments, layer 416A is formed by thermal nitridation of silicon, plasma enhanced chemical vapor deposition (PECVD), plasma anodic nitridation or another suitable process. In some embodiments, layer 416A includes multiple layers of material to gain process flexibility. In some embodiments, layer 416A includes a first oxide layer deposited on third mandrel features 414A-414T and exposed portions of first spacers 406A-406J, ESL portions 408B, 408D, 408F, 408H and 408J, and ESL portions 410B-410E, a silicon nitride layer deposited on the first oxide layer, and a second silicon oxide layer deposited on the silicon nitride layer. In some embodiments, the one or more layers comprising layer 416A are formed by thermal oxidation, a chemical vapor deposition (CVD) process, plasma enhanced CVD (PECVD) and/or atomic layer deposition (ALD).

In FIG. 4M, a portion of layer 416A is removed, which leaves etch stop layer (ESL) portions 416B-416T, and results in arrangement 400M.

ESL portions 416B-416T are centered over first spacers 406A-406J, ESL portions 408B, 408D, 408F, 408H and 408J, and ESL portions 410B-410E. ESL portions 416B-416T have an etch sensitivity ES416 that is different than etch sensitivities ES406, ES408 and ES410. In some embodiments, the portion of layer 416A is removed using chemical mechanical polishing (CMP). In some embodiments, the CMP produces an approximately planar surface. In some embodiments, relative to the reference direction: widths of first spacers 406A-406J, ESL portions 408B, 408D, 408F, 408H and 408J, and ESL portions 410B-410E are approximately (if not exactly) twice the width of ESL portions 416B-416T. ESL portions 416B-416T are used as hard masks during subsequent etching processes.

In FIG. 4N, third mandrel features 414A-414T are removed, which leaves regions over first spacers 406A-406J, ESL portions 408B, 408D, 408F, 408H and 408J, and ESL portions 410B-410E exposed and results in arrangement 400N.

In some embodiments, third mandrel features 414A-414T are removed by an etching process tuned to remove the material from which third mandrel features 414A-414T are built but not first spacers 406A-406J, ESL portions 408B, 408D, 408F, 408H and 408J, nor ESL portions 410B-410E. In some embodiments, the etching process is a wet etching, a dry etching, or a combination thereof.

In FIG. 4O, exposed regions of first spacers 406A-406J, ESL portions 408B, 408D, 408F, 408H and 408J, and ESL portions 410B-410E are removed, which leaves regions over layer 402 exposed, and results in an arrangement 400O.

In some embodiments, exposed regions of first spacers 406A-406J, ESL portions 408B, 408D, 408F, 408H and 408J, and ESL portions 410B are removed in a multi-step etching process. In some embodiments, the multi-step etching process includes at least three steps. In the first step, arrangement 400O is etched with an etchant appropriate to etch sensitivity ES406 of first spacers 406A-406J, which results in an intermediate structure 400O' (not shown). In the second step, intermediate structure 400O' is etched with an etchant appropriate to second etch sensitivity ES408 of ESL portions 408B', 408D', 408F', 408H' and 408J', which results in an intermediate structure 400O" (not shown). In the third step, intermediate structure 400O" is etched with an etchant appropriate to etch sensitivity ES410 of ESL portions 410B'-410E'. In some embodiments, one or more of the etchants includes a selective wet etch or a selective dry etch. In some embodiments, the etching process is a wet etching, a dry etching, or a combination thereof. In some embodiments, the three etchants (namely, the first, second and third etchants) are selected from the group consisting of HF, HNO3, H2SO4 and NH4OH, with the determination of which etchant to be used as the first, second and third etchants depending upon the material to be etched. In some embodiments, etching can be implemented using inductively coupled plasma (ICP) etching, reactive-ion etching (RIE) or another etching process, which are controlled in part by tuning the input gases, e.g., CF4, Ar, O2, Cl2, CF3I, NH3 or other suitable gases.

In some embodiments, a wet etching uses an etching solution including tetramethylammonium hydroxide (TMAH), HF/HNO3/CH3COOH solution or another suitable solution. In some embodiments, the third step is a dry etching process, e.g., a biased plasma etching process that uses a chlorine-based chemistry. In some embodiments, other dry etchant gasses include CF4, NF3, SF6, and He. In some embodiments, the order of the first, second and third etching steps is altered, e.g., reversed.

In some embodiments, the various etch sensitivities relate as α*ES406≤ES408, β*ES408≤ES410. In some embodiments, the various etch sensitivities relate as γ*ES410≤ES408, δ*ES408≤ES406. In some embodiments, the various etch sensitivities relate as λ*ES406≤ES408 and λ*ES408≤ES410. In some embodiments, the various etch sensitivities relate as σ*ES410≤ES406 and σ*ES406≤ES408. In some embodiments, the various etch sensitivities relate as τ*ES408≤ES410 and τ*ES410≤ES406. In some embodiments, the variables α, β, γ, δ, λ, σ and τ are positive integers. In some embodiments, at least one of the variables α, β, γ, δ, λ, σ or τ is equal to 2. Other relations between the various etch sensitivities are contemplated.

In FIG. 4P, exposed regions of layer 402 are removed, which regions over fin 308 exposed, and results in an arrangement 400P.

In some embodiments, a fourth etchant appropriate to an etch sensitivity ES308 of layer 402 is used to etch layer 402 but not first spacers 406A-406J, ESL portions 408B, 408D, 408F, 408H and 408J, nor ESL portions 410B-410E which are protected by ESL portions 416B-416T.

In some embodiments, the etching process is a wet etching, a dry etching, or a combination thereof. In some embodiments, the four etchants (namely, the first, second, third and fourth etchants) are selected from the group consisting of HF, HNO3, H2SO4 and NH4OH, with the determination of which etchant to be used as the first, second, third and fourth etchants depending upon the material to be etched. In some embodiments, etching can be implemented using inductively coupled plasma (ICP) etching, reactive-ion etching (RIE) or another etching process, which are controlled in part by tuning the input gases, e.g., CF4, Ar, O2, Cl2, CF3I, NH3 or other suitable gases.

As noted, the layouts of FIGS. 3A-3J and the cross-sections of FIGS. 4A-4Z represent structures, including conductors, for a semiconductor device which is a negative-edge-triggered clock latch circuit. Also, as noted in other embodiments, structures (including conductors) for other semiconductor devices are contemplated.

FIG. 5A is a plan-view layout diagram of conductors for a semiconductor device in accordance with at least one embodiment of the present disclosure.

The semiconductor device of FIG. 5A is another example of a semiconductor device which can be manufactured in accordance with at least one embodiment of the present disclosure. In FIG. 5A, in particular, the semiconductor device is a multiplexer.

FIG. 5B is a plan-view layout diagram of conductors for a semiconductor device in accordance with at least one embodiment of the present disclosure.

In FIG. 5B, the semiconductor device is a buffer circuit.

The semiconductor device of FIG. 5B is another example of a semiconductor device which can be manufactured in accordance with at least one embodiment of the present disclosure.

FIG. 5C, in particular, is a plan-view layout diagram of conductors for a semiconductor device in accordance with at least one embodiment of the present disclosure.

The semiconductor device of FIG. 5C is another example of a semiconductor device which can be manufactured in accordance with at least one embodiment of the present disclosure. In FIG. 5C, in particular, the semiconductor device is an and-or-invert circuit.

Figure 6A:
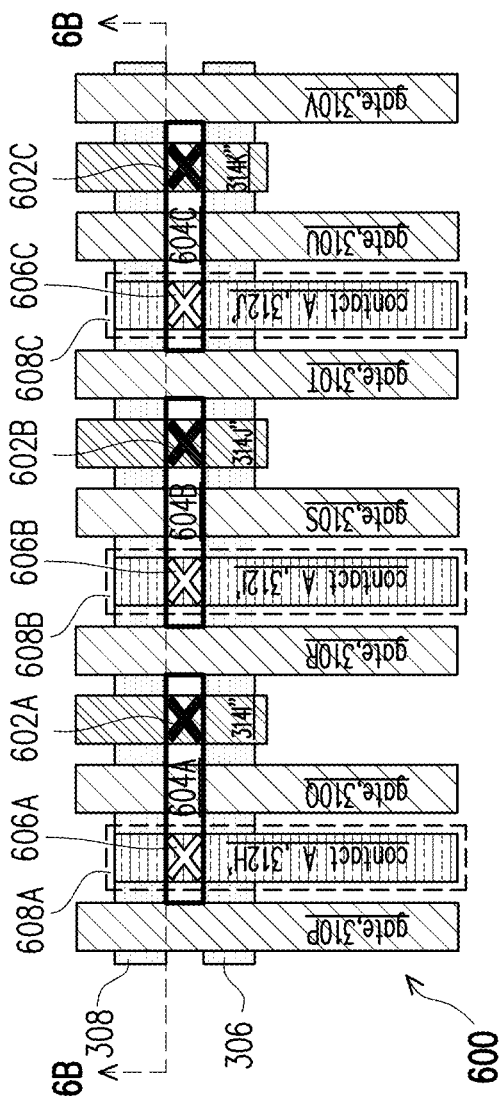
FIG. 6A is a plan-view layout diagram of a portion of conductors (as in FIG. 3I) for a semiconductor device in accordance with at least one embodiment of the present disclosure.

FIG. 6A is a plan-view layout diagram of a portion 600 (as in FIG. 3I) of conductors for a semiconductor device in accordance with at least one embodiment of the present disclosure.

Figure 6B:
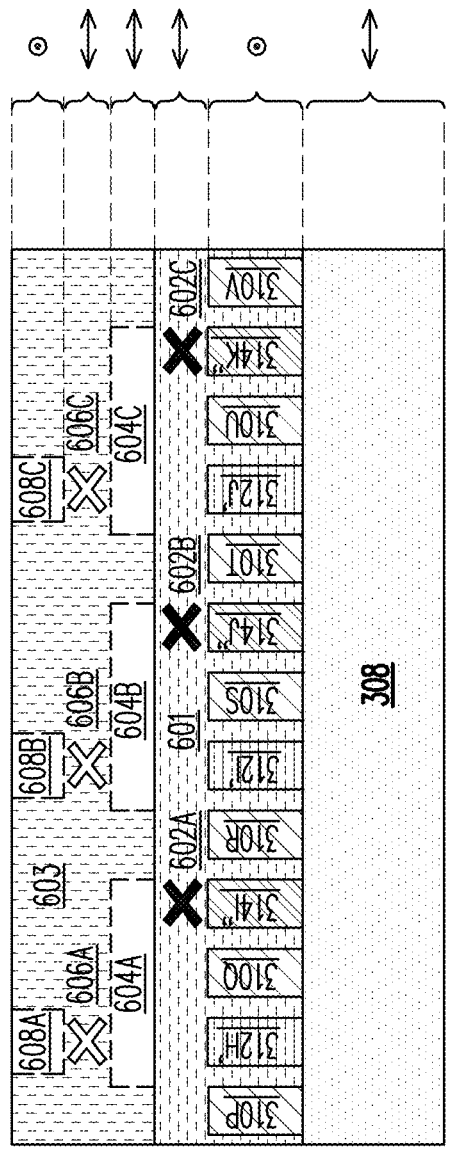
FIG. 6B is a cross-section of a stage in the manufacture of conductors for the semiconductor device of FIG. 6A in accordance with at least one embodiment of the present disclosure.

FIG. 6B is a cross-section of a stage in the manufacture of conductors for the semiconductor device of FIG. 6A in accordance with at least one embodiment of the present disclosure.

FIGS. 6A-6B relate to FIGS. 3A-3J and 4A-4Z as follows. It is to be recalled that the plan-view layout of FIG. 3I relates to the cross-section of FIG. 4U, and that the cross-section of FIG. 4Z relates to a stage of manufacture subsequent to the stage of manufacture to which the cross-section of FIG. 4U relates. With that in mind, the cross-section of FIG. 6B relates to a stage of manufacture subsequent to the stage of manufacture to which the cross-section of FIG. 4Z relates. Thus, the plan-view layout of FIG. 6A also relates to a stage of manufacture subsequent to the stage of manufacture to which the cross-section of FIG. 4Z relates.

In FIG. 6B, gates 310P-310V, conductors 312I'-312J' and conductors 314I"-314K" are encapsulated in a first interlayer dielectric (ILD) layer 601. First ILD layer 601 includes first vias 602A-602C are formed on corresponding conductors 314I"-314K". A second ILD layer 603 is formed on first ILD layer 601. Second ILD layer 603 includes: first metallization layer segments 604A-604C connected to corresponding first vias 602A-602C; second vias 606A-606C formed on corresponding first metallization layer segments 604A-604C; and second metal layer segments 608A-608C connected to corresponding second vias 606A-606C.

Figure 7:
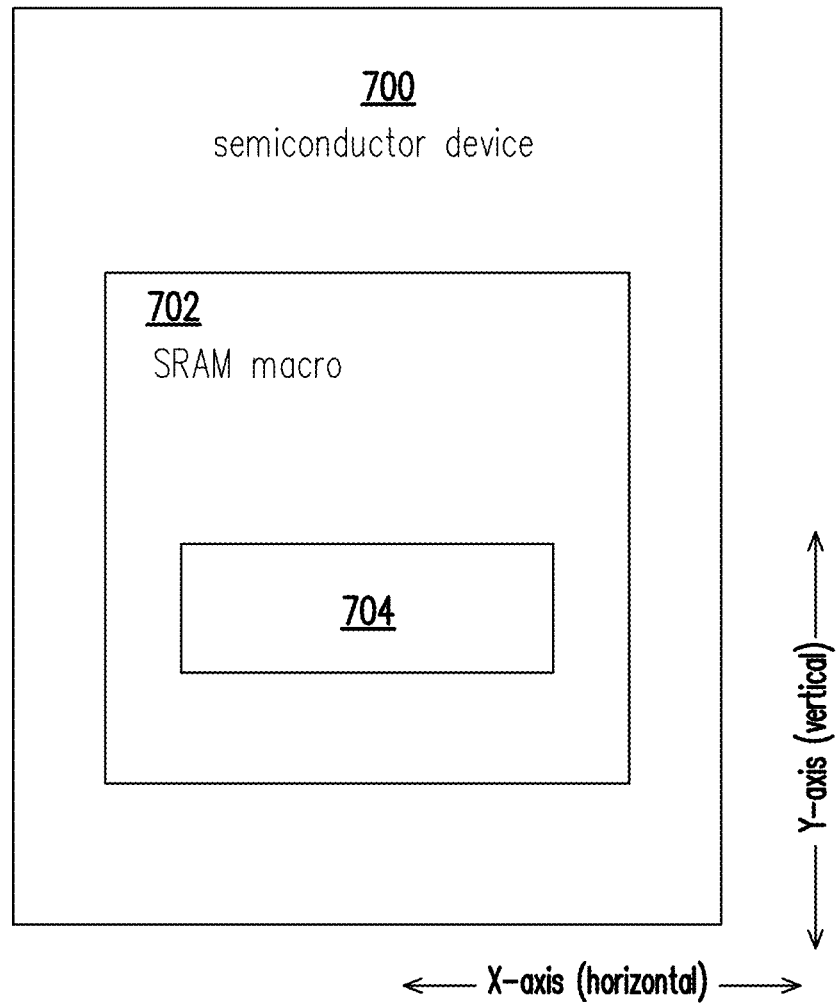
FIG. 7 is a block diagram of a semiconductor device in accordance with at least one embodiment of the present disclosure.

FIG. 7 is a block diagram of a semiconductor device 700 in accordance with at least one embodiment of the present disclosure.

The semiconductor device of 700 is another example of a semiconductor device which can be manufactured in accordance with at least one embodiment of the present disclosure. In FIG. 7, semiconductor device 700 includes, among other things, an SRAM macro 702. SRAM macro 702 includes, among other things, a circuit 704. Examples of circuit 704 include the negative-edge-triggered clock latch circuit of FIG. 3J, the multiplexer of FIG. 5A, the buffer circuit of FIG. 5B or the and-or-invert circuit of FIG. 5C.

One of ordinary skill in the art would recognize that operations are able to be removed or that additional operations are able to be added to at least one of the above-noted methods without departing from the scope of this description. One of ordinary skill in the art would also recognize that an order of operations in at least one of the above-noted methods is able to be adjusted without departing from the scope of this description.

In an embodiment, an arrangement of conductors (for manufacturing a semiconductor device) includes: a base including parallel transistor-channel structures arranged in a first direction; first conductors arranged parallel to a second direction and which are capped with corresponding first or second caps, each first cap having a first etch sensitivity, each second cap having a second etch sensitivity, the second direction being orthogonal to the first direction; and second conductors arranged parallel to and interspersed with the first conductors and which are capped with third caps, each third cap having a third etch sensitivity; and wherein the first conductors are organized into at least first and second sets; and the first, second and third etch sensitivities being different from each other. In an embodiment, the transistor-channel structures are fins; the first conductors are drain/source electrodes; the second conductors are gate electrodes; and for a given region including corresponding sections of one or more of the fins, a corresponding one of the gate electrodes and corresponding ones of drain/source electrodes represent components of a Fin-FET. In an embodiment, the first, second and third etch sensitivities are represented correspondingly as ES1, ES2 and ES3 and relate according to one of the following relations: $2*ES1 \le ES2$ and $2*ES2 \le ES3$; $2*ES3 \le ES2$ and $2*ES2 \le ES1$; $2*ES3 \le ES1$ and $2*ES1 \le ES2$; or $2*ES2 \le ES3$ and $2*ES3 \le ES1$.

In some embodiments, a system for manufacturing a semiconductor device, the system including: at least one processor; and at least one memory including computer program code for one or more programs; wherein the at least one memory, the computer program code and the at least one processor are configured to cause the system to execute: generating a layout diagram, the layout diagram being stored on a non-transitory computer-readable medium, the generating the layout diagram including: generating fin shapes, long axes of the fin shapes extending substantially parallel to a first direction; generating first and second conductor shapes correspondingly over the fin shapes, long axes of the first and second conductor shapes extending substantially parallel to a second direction, the second direction being substantially perpendicular to the first direction; arranging a first sequence of alternating ones of the first and second conductor shapes relative to the first direction; inserting a corresponding one of the second conductor shapes between each neighboring pair of corresponding ones of the first conductor shapes; generating first, second, and third cap shapes correspondingly over the first and second conductor shapes, long axes of the first, second, and third cap shapes extending substantially parallel to the second direction; generating first cut patterns over selected portions of corresponding ones of the first cap shapes and over corresponding portions of corresponding neighboring ones of the third cap shapes; designating the first cut patterns as selective for a first etch sensitivity corresponding to the first cap shapes; generating second cut patterns over selected portions of corresponding ones of the second cap shapes and over corresponding portions of corresponding neighboring ones of the third cap shapes; and designating the second cut patterns as selective for a second etch sensitivity corresponding to the second cap shapes. In some embodiments, the system further includes at least one of: a masking facility configured to fabricate one or more semiconductor masks based on based on the layout diagram; or a fabricating facility configured to fabricate at least one component in a layer of a semiconductor device based on the layout diagram. In some embodiments, the generating first cut patterns includes: extending spans of the first cut patterns over corresponding portions of corresponding neighboring ones of the third cap shapes; and the generating second cut patterns includes: extending spans of the second cut patterns over corresponding portions of corresponding neighboring ones of the third cap shapes. In some embodiments, the arranging a corresponding one of the second conductor shapes to be interspersed between each pair of neighboring ones of the first conductor shapes results in: first combinations of corresponding ones of the first cap shapes and corresponding ones of the first conductor shapes; second combinations of corresponding ones of the second corresponding ones of the first conductor shapes; third combinations of corresponding ones of the third cap shapes and corresponding ones of the second conductor shapes; and the third combinations being interspersed with the first and second combinations. In some embodiments, the generating the layout diagram further includes: designating the second conductor shapes as gate shapes which represent corresponding gate electrodes in the semiconductor device based on the layout diagram; and designating the first conductor shapes as source/drain shapes which represent corresponding source/drain electrodes in a semiconductor device based on the layout diagram. In some embodiments, the generating the layout diagram further includes: designating the first cut patterns as selective for a first etch sensitivity corresponding to the first cap shapes; and designating the second cut patterns as selective for a second etch sensitivity corresponding to the second cap shapes. In some embodiments, the first etch sensitivity and the second etch sensitivity are represented correspondingly as ES1 and ES2, and relate according to one of the following relation: $2*ES1 \le ES2$. In some embodiments, the generating the layout diagram further includes: generating transistor-channel shapes, long axes of the transistor-channel shapes extending substantially parallel to the second direction; and disposing the transistor-channel shapes under corresponding ones of the first and second conductor shapes. In some embodiments, the transistor-channel shapes, are fin shapes which represent corresponding fin structures in a semiconductor device based on the layout diagram.

In some embodiments, a system for manufacturing a semiconductor device, the system including: at least one processor; and at least one memory including computer program code for one or more programs; wherein the at least one memory, the computer program code and the at least one processor are configured to cause the system to execute: generating a layout diagram, the layout diagram being stored on a non-transitory computer-readable medium, the generating the layout diagram including: a base shape including parallel transistor-channel structure shapes arranged in a first direction; first conductor shapes arranged parallel to a second direction and which are capped with corresponding first or second caps, each first cap having a first etch sensitivity, each second cap having a second etch sensitivity, the second direction being orthogonal to the first direction; and second conductor shapes arranged parallel to and interspersed with the first conductor shapes and which are capped with third caps, each third cap having a third etch sensitivity; and wherein: the first conductor shapes are organized into at least first and second sets; and the first, second and third etch sensitivities being different from each other. In some embodiments, the transistor-channel structure shapes are fin shapes; the first conductor shapes are drain/source electrode shapes; the second conductor shapes are gate electrode shapes; and for a given region including corresponding sections of one or more of the fin shapes, a corresponding one of the gate electrode shapes and corresponding ones of drain/source electrode shapes represent components of a Fin-FET. In some embodiments, the first, second and third etch sensitivities are represented correspondingly as ES1, ES2 and ES3 and relate according to one of the following relations: $2*ES1 \le ES2$ and $2*ES2 \le ES3$; $2*ES3 \le ES2$ and $2*ES2 \le ES1$; $2*ES3 \le ES1$ and $2*ES1 \le ES2$; or $2*ES2 \le ES3$ and $2*ES3 \le ES1$. In some embodiments, the base includes fin shapes arranged parallel to the first direction. In some embodiments, the first conductor shapes represent drain/source electrode shapes relative to corresponding regions of the fin shapes; the second conductor shapes represent gate electrode shapes relative to corresponding regions of the fin shapes; and wherein the drain/source electrode shapes and the gate electrode shapes are interspersed to provide Fin-FETs. In some embodiments, the system further includes at least one of: a masking facility configured to fabricate one or more semiconductor masks based on based on the layout diagram; or a fabricating facility configured to fabricate at least one component in a layer of a semiconductor device based on the layout diagram.

In some embodiments, a system for manufacturing a semiconductor device, the system including: at least one processor; and at least one memory including computer program code for one or more programs; wherein the at least one memory, the computer program code and the at least one processor are configured to cause the system to execute: generating a layout diagram, the layout diagram being stored on a non-transitory computer-readable medium, the generating the layout diagram including: parallel transistor-channel structure shapes arranged in a first direction; first conductor shapes arranged parallel to a second direction wherein the second direction is orthogonal to the first direction and wherein the first conductor shapes include: a first set of the first conductor shapes which are each capped with a first cap having a first etch sensitivity; a second set of the first conductor shapes which are each capped with a second cap having a second etch sensitivity; second conductor shapes arranged parallel to and interspersed with the first conductor shapes and which are capped with third caps, each third cap having a third etch sensitivity; and wherein the first, second and third etch sensitivities are different from each other. In some embodiments, the transistor-channel structure shapes are fin shapes; the first set of the first conductor shapes are drain/source electrode shapes; the second set of the first conductor shapes are other drain/source electrode shapes; the second conductor shapes are gate electrode shapes; and for a given region including corresponding sections of one or more of the fin shapes, a corresponding one of the gate electrode shapes and corresponding ones of drain/source electrode shapes represent components of a Fin-FET. In some embodiments, the system further includes at least one of: a masking facility configured to fabricate one or more semiconductor masks based on based on the layout diagram; or a fabricating facility configured to fabricate at least one component in a layer of a semiconductor device based on the layout diagram. In some embodiments, the first conductor shapes, including the first set and the second set, are substantially a same width. In some embodiments, the transistor-channel structure shapes include fins arranged parallel to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A system for manufacturing a semiconductor device, the system comprising:
    at least one processor; and
    at least one memory including computer program code for one or more programs;
    wherein the at least one memory, the computer program code and the at least one processor are configured to cause the system to execute:
        generating a layout diagram, the layout diagram being stored on a non-transitory computer-readable medium, the generating the layout diagram including:
            generating fin shapes, long axes of the fin shapes extending substantially parallel to a first direction;
            generating first and second conductor shapes correspondingly over the fin shapes, long axes of the first and second conductor shapes extending substantially parallel to a second direction, the second direction being substantially perpendicular to the first direction;
            arranging a first sequence of alternating ones of the first and second conductor shapes relative to the first direction;
            inserting a corresponding one of the second conductor shapes between each neighboring pair of corresponding ones of the first conductor shapes;
            generating first, second, and third cap shapes correspondingly over the first and second conductor shapes, long axes of the first, second, and third cap shapes extending substantially parallel to the second direction;
            generating first cut patterns over selected portions of corresponding ones of the first cap shapes and over corresponding portions of corresponding neighboring ones of the third cap shapes;
            designating the first cut patterns as selective for a first etch sensitivity corresponding to the first cap shapes;
            generating second cut patterns over selected portions of corresponding ones of the second cap shapes and over corresponding portions of corresponding neighboring ones of the third cap shapes; and
            designating the second cut patterns as selective for a second etch sensitivity corresponding to the second cap shapes.

2. The system of claim 1, further comprising at least one of:
    a masking facility configured to fabricate one or more semiconductor masks based on based on the layout diagram; or
    a fabricating facility configured to fabricate at least one component in a layer of a semiconductor device based on the layout diagram.

3. The system of claim 1, wherein:
    the generating first cut patterns includes:
        extending spans of the first cut patterns over corresponding portions of corresponding neighboring ones of the third cap shapes; and
    the generating second cut patterns includes:
        extending spans of the second cut patterns over corresponding portions of corresponding neighboring ones of the third cap shapes.

4. The system of claim 1, wherein:
    the arranging a corresponding one of the second conductor shapes to be interspersed between each pair of neighboring ones of the first conductor shapes results in:
        first combinations of corresponding ones of the first cap shapes and corresponding ones of the first conductor shapes;
        second combinations of corresponding ones of the second cap shapes and corresponding ones of the first conductor shapes;

third combinations of corresponding ones of the third cap shapes and corresponding ones of the second conductor shapes; and the third combinations being interspersed with the first and second combinations.

5. The system of claim 1, wherein the generating the layout diagram further includes:

designating the second conductor shapes as gate shapes which represent corresponding gate electrodes in the semiconductor device based on the layout diagram; and designating the first conductor shapes as source/drain shapes which represent corresponding source/drain electrodes in a semiconductor device based on the layout diagram.

6. The system of claim 1, wherein the generating the layout diagram further includes:

designating the first cut patterns as selective for a first etch sensitivity corresponding to the first cap shapes; and designating the second cut patterns as selective for a second etch sensitivity corresponding to the second cap shapes.

7. The system of claim 6, wherein the first etch sensitivity and the second etch sensitivity are represented correspondingly as ES1 and ES2, and relate according to one of the following relation: 2*ES1≤ES2.

8. The system of claim 1, wherein the generating the layout diagram further includes:

generating transistor-channel shapes, long axes of the transistor-channel shapes extending substantially parallel to the second direction; and disposing the transistor-channel shapes under corresponding ones of the first and second conductor shapes.

9. The system of claim 8, wherein:

the transistor-channel shapes, are fin shapes which represent corresponding fin structures in a semiconductor device based on the layout diagram.

10. A system for manufacturing a semiconductor device, the system comprising:

at least one processor; and at least one memory including computer program code for one or more programs;

wherein the at least one memory, the computer program code and the at least one processor are configured to cause the system to execute:

generating a layout diagram, the layout diagram being stored on a non-transitory computer-readable medium, the generating the layout diagram including:

generating a base shape including parallel transistor-channel structure shapes arranged in a first direction;

generating first conductor shapes arranged parallel to a second direction and which are capped with corresponding first or second caps, each first cap having a first etch sensitivity, each second cap having a second etch sensitivity, the second direction being orthogonal to the first direction; and generating second conductor shapes arranged parallel to and interspersed with the first conductor shapes and which are capped with third caps, each third cap having a third etch sensitivity; and wherein:

the first conductor shapes are organized into at least first and second sets; and the first, second and third etch sensitivities are different from each other.

11. The system of claim 10, wherein:

the transistor-channel structure shapes are fin shapes;

the first conductor shapes are drain/source electrode shapes;

the second conductor shapes are gate electrode shapes; and for a given region including corresponding sections of one or more of the fin shapes, a corresponding one of the gate electrode shapes and corresponding ones of drain/source electrode shapes represent components of a Fin-FET.

12. The system of claim 10, wherein the first, second and third etch sensitivities are represented correspondingly as ES1, ES2 and ES3 and relate according to one of the following relations:

2*ES1≤ES2 and 2*ES2≤ES3;

2*ES3≤ES2 and 2*ES2≤ES1;

2*ES3≤ES1 and 2*ES1≤ES2; or

2*ES2≤ES3 and 2*ES3≤ES1.

13. The system of claim 10, wherein the base shape includes fin shapes arranged parallel to the first direction.

14. The system of claim 11, wherein:

the first conductor shapes represent drain/source electrode shapes relative to corresponding regions of the fin shapes;

the second conductor shapes represent gate electrode shapes relative to corresponding regions of the fin shapes; and wherein the drain/source electrode shapes and the gate electrode shapes are interspersed to provide Fin-FETs.

15. The system of claim 10, further comprising at least one of:

a masking facility configured to fabricate one or more semiconductor masks based on based on the layout diagram; or a fabricating facility configured to fabricate at least one component in a layer of a semiconductor device based on the layout diagram.

16. A system for manufacturing a semiconductor device, the system comprising:

at least one processor; and at least one memory including computer program code for one or more programs;

wherein the at least one memory, the computer program code and the at least one processor are configured to cause the system to execute:

generating a layout diagram, the layout diagram being stored on a non-transitory computer-readable medium, the generating the layout diagram including:

generating parallel transistor-channel structure shapes arranged in a first direction;

generating first conductor shapes arranged parallel to a second direction wherein the second direction is orthogonal to the first direction and wherein the first conductor shapes include:

a first set of the first conductor shapes which are each capped with a first cap having a first etch sensitivity;

a second set of the first conductor shapes which are each capped with a second cap having a second etch sensitivity;

second conductor shapes arranged parallel to and interspersed with the first conductor shapes and which are capped with third caps, each third cap having a third etch sensitivity; and wherein the first, second and third etch sensitivities are different from each other.

17. The system of claim 16, wherein:
the transistor-channel structure shapes are fin shapes;
the first set of the first conductor shapes are drain/source electrode shapes;
the second set of the first conductor shapes are other drain/source electrode shapes;
the second conductor shapes are gate electrode shapes; and
for a given region including corresponding sections of one or more of the fin shapes, a corresponding one of the gate electrode shapes and corresponding ones of drain/source electrode shapes represent components of a Fin-FET.

18. The system of claim 16, further comprising at least one of:
a masking facility configured to fabricate one or more semiconductor masks based on based on the layout diagram; or
a fabricating facility configured to fabricate at least one component in a layer of a semiconductor device based on the layout diagram.

19. The system of claim 16, wherein the first conductor shapes, including the first set and the second set, are substantially a same width.

20. The system of claim 16, wherein the transistor-channel structure shapes include fins arranged parallel to the first direction.

* * * * *